(12) United States Patent
Larson, III et al.

(10) Patent No.: US 7,367,095 B2
(45) Date of Patent: May 6, 2008

(54) METHOD OF MAKING AN ACOUSTICALLY COUPLED TRANSFORMER

(75) Inventors: John D. Larson, III, Palo Alto, CA (US); Yury Oshmyansky, Laguna Beach, CA (US)

(73) Assignee: Avago Technologies General IP Pte Ltd, Singapore (SG)

( * ) Notice: Subject to any disclaimer, the term of this patent is extended or adjusted under 35 U.S.C. 154(b) by 0 days.

(21) Appl. No.: 11/404,403

(22) Filed: Apr. 14, 2006

(65) Prior Publication Data

US 2006/0185139 A1   Aug. 24, 2006

Related U.S. Application Data

(60) Division of application No. 10/836,663, filed on Apr. 29, 2004, now Pat. No. 7,091,649, which is a continuation-in-part of application No. 10/699,481, filed on Oct. 30, 2003, now Pat. No. 6,946,928.

(51) Int. Cl.
*H04R 17/00* (2006.01)
*H01L 41/00* (2006.01)
*H03H 9/02* (2006.01)

(52) U.S. Cl. .................. 29/25.35; 29/602.1; 29/831; 29/846; 310/320; 333/189

(58) Field of Classification Search .............. 29/23.35, 29/602.1, 831, 846; 310/320, 366; 333/189, 333/133, 187–192; 427/100
See application file for complete search history.

(56) References Cited

U.S. PATENT DOCUMENTS

| | | |
|---|---|---|
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al. |

(Continued)

FOREIGN PATENT DOCUMENTS

DE    101 60 617    5/2003

(Continued)

OTHER PUBLICATIONS

B. Hadimioglu et al., "Polymer Files As Acoustic Matching Layers", 1990 IEEE Ultrasonics Sysmposium Proceedings, vol. 3 pp. 1337-1340, Dec., 1990.

(Continued)

*Primary Examiner*—A. Dexter Tugbang
*Assistant Examiner*—Tai Van Nguyen

(57) ABSTRACT

Embodiments of an acoustically-coupled transformer have a first stacked bulk acoustic resonator (SBAR) and a second SBAR. Each of the SBARs has a lower film bulk acoustic resonator (FBAR) and an upper FBAR, and an acoustic decoupler between the FBARs. The upper FBAR is stacked atop the lower FBAR. Each FBAR has opposed planar electrodes and a piezoelectric element between the electrodes. The piezoelectric element is characterized by a c-axis. The c-axes of the piezoelectric elements of the lower FBARs are opposite in direction, and the c-axes of the piezoelectric elements of the upper FBARs are opposite in direction. The transformer additionally has a first electrical circuit connecting the lower FBAR of the first SBAR to the lower FBAR of the second SBAR, and a second electrical circuit connecting the upper FBAR of the first SBAR to the upper FBARs of the second SBAR.

13 Claims, 12 Drawing Sheets

U.S. PATENT DOCUMENTS

| | | | |
|---|---|---|---|
| 3,568,108 A * | 3/1971 | Poirier et al. ............... 333/187 |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,355,408 A | 10/1982 | Scarrott |
| 4,456,850 A | 6/1984 | Inoue et al. |
| 4,529,904 A | 7/1985 | Hattersley |
| 4,625,138 A | 11/1986 | Ballato |
| 4,719,383 A | 1/1988 | Wang et al. |
| 4,798,990 A | 1/1989 | Henoch |
| 4,836,882 A | 6/1989 | Ballato |
| 4,841,429 A | 6/1989 | McClanahan et al. |
| 4,906,840 A | 3/1990 | Zdeblick et al. |
| 5,048,038 A | 9/1991 | Brennan et al. |
| 5,118,982 A | 6/1992 | Inoue et al. |
| 5,129,132 A | 7/1992 | Zdeblick et al. |
| 5,162,691 A * | 11/1992 | Mariani et al. ............. 310/321 |
| 5,241,209 A | 8/1993 | Sasaki |
| 5,241,456 A | 8/1993 | Marcinkiewicz et al. |
| 5,294,898 A | 3/1994 | Dworsky et al. |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Bolorforosh |
| 5,587,620 A | 12/1996 | Ruby |
| 5,589,858 A | 12/1996 | Kadowaki et al. |
| 5,594,705 A | 1/1997 | Connor et al. |
| 5,671,242 A | 10/1997 | Takiguchi et al. |
| 5,692,279 A * | 12/1997 | Mang et al. ............... 29/25.35 |
| 5,714,917 A | 2/1998 | Ella |
| 5,853,601 A | 12/1998 | Krishaswamy et al. |
| 5,864,261 A | 1/1999 | Weber |
| 5,872,493 A | 2/1999 | Ella |
| 5,873,153 A | 2/1999 | Ruby et al. |
| 5,873,154 A * | 2/1999 | Ylilammi et al. ........... 29/25.35 |
| 5,894,647 A * | 4/1999 | Lakin ........................ 29/25.35 |
| 5,910,756 A | 6/1999 | Ella |
| 5,936,150 A | 8/1999 | Kobrin et al. |
| 5,953,479 A | 9/1999 | Zhou et al. |
| 5,982,297 A | 11/1999 | Welle |
| 6,040,962 A * | 3/2000 | Kanazawa et al. ........... 360/322 |
| 6,060,818 A | 5/2000 | Ruby et al. |
| 6,087,198 A | 7/2000 | Panasik |
| 6,107,721 A | 8/2000 | Lakin |
| 6,111,480 A | 8/2000 | Iyama et al. |
| 6,124,756 A | 9/2000 | Yaklin et al. |
| 6,150,703 A | 11/2000 | Cushman et al. |
| 6,187,513 B1 * | 2/2001 | Katakura ..................... 430/312 |
| 6,215,375 B1 * | 4/2001 | Larson et al. ............... 333/187 |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 * | 7/2001 | Bradley et al. ............. 333/133 |
| 6,265,246 B1 | 7/2001 | Ruby et al. |
| 6,278,342 B1 | 8/2001 | Ella |
| 6,292,336 B1 * | 9/2001 | Horng et al. ........... 360/324.12 |
| 3,607,761 A1 | 10/2001 | Nakagawa |
| 6,307,447 B1 | 10/2001 | Barber et al. |
| 6,376,280 B1 | 4/2002 | Ruby et al. |
| 6,377,137 B1 | 4/2002 | Ruby |
| 6,384,697 B1 | 5/2002 | Ruby |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,462,631 B2 | 10/2002 | Bradley et al. |
| 6,466,105 B1 | 10/2002 | Lobl et al. |
| 6,466,418 B1 * | 10/2002 | Horng et al. ........... 360/324.12 |
| 6,469,597 B2 * | 10/2002 | Ruby et al. ................. 333/187 |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 * | 11/2002 | Larson et al. ............... 310/348 |
| 6,486,751 B1 | 11/2002 | Barber et al. |
| 6,489,688 B1 | 12/2002 | Baumann et al. |
| 6,492,883 B2 | 12/2002 | Liang et al. |
| 6,906,451 B2 | 12/2002 | Yamada |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panasik |
| 6,550,664 B2 | 4/2003 | Bradley et al. |
| 6,564,448 B1 | 5/2003 | Oura et al. |
| 6,566,979 B2 | 5/2003 | Larson et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,600,390 B2 | 7/2003 | Frank |
| 6,601,276 B2 | 8/2003 | Barber |
| 6,617,249 B2 | 9/2003 | Ruby et al. |
| 6,617,750 B2 | 9/2003 | Dummermuth et al. |
| 6,630,753 B2 | 10/2003 | Malik et al. |
| 6,635,509 B1 | 10/2003 | Ouellet |
| 6,639,872 B1 | 10/2003 | Rein |
| 6,651,488 B2 | 11/2003 | Larson et al. |
| 6,657,363 B1 | 12/2003 | Aigner |
| 6,668,618 B2 | 12/2003 | Larson et al. |
| 6,670,866 B2 | 12/2003 | Ella et al. |
| 6,693,500 B2 | 2/2004 | Yang et al. |
| 6,710,508 B2 | 3/2004 | Ruby et al. |
| 6,710,681 B2 | 3/2004 | Figueredo et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Piazza et al. |
| 7,091,649 B2 | 4/2004 | Larson, III |
| 6,774,476 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,828,713 B2 | 12/2004 | Bradley et al. |
| 6,842,088 B2 | 1/2005 | Yamada et al. |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,936,928 B2 | 8/2005 | Hedler et al. |
| 6,936,954 B2 | 8/2005 | Peczalski |

| | | | | | |
|---|---|---|---|---|---|
| 6,954,121 B2 | 10/2005 | Bradley et al. | 2007/0171002 A1 | 7/2007 | Unkrich |
| 6,936,257 B1 | 11/2005 | Ella et al. | | | |
| 6,963,257 B2 | 11/2005 | Ella | | | |

FOREIGN PATENT DOCUMENTS

| | | |
|---|---|---|
| EP | 0865157 | 9/1998 |
| EP | 0 880 227 | 11/1998 |
| EP | 1 047 189 | 4/1999 |
| EP | 0973256 | 1/2000 |
| EP | 1 100 196 | 5/2001 |
| EP | 1096259 | 5/2001 |
| EP | 1258990 | 11/2002 |
| EP | 1180494 | 3/2003 |
| EP | 1 542 362 | 6/2003 |
| EP | 1 557 945 | 10/2003 |
| EP | 1258989 | 1/2004 |
| EP | 1528674 | 6/2004 |
| EP | 1528675 | 6/2004 |
| EP | 1528677 | 7/2004 |
| EP | 1 517 444 | 8/2004 |
| EP | 1249932 | 3/2005 |
| EP | 1517443 | 3/2005 |
| EP | 1575165 | 9/2005 |
| GB | 1207974 | 11/1967 |
| GB | 2411239 | 8/2005 |
| GB | 2418791 | 4/2006 |
| JP | 2002-217676 | 8/2002 |
| WO | WO 98/16957 | 4/1998 |
| WO | WO-01/06647 | 1/2001 |
| WO | WO-01/99276 | 12/2001 |
| WO | WO-02/103900 | 12/2002 |
| WO | WO-03/043188 | 5/2003 |
| WO | WO 03/050950 | 6/2003 |
| WO | WO 03/058809 | 7/2003 |
| WO | WO 2003/05880 | 7/2003 |
| WO | WO 03/030358 | 10/2003 |
| WO | WO 2004/034579 | 4/2004 |
| WO | WO-2004/051744 | 6/2004 |
| WO | WO-2005/043752 | 5/2005 |
| WO | WO-2005/043753 | 5/2005 |
| WO | WO-2005/043756 | 5/2005 |

| | | |
|---|---|---|
| 6,975,183 B2 | 12/2005 | Aigner et al. |
| 6,977,563 B2 | 12/2005 | Komuro et al. |
| 6,985,052 B2 | 1/2006 | Tikka |
| 6,987,433 B2 | 1/2006 | Larson |
| 6,989,723 B2 | 1/2006 | Komuro et al. |
| 6,998,940 B2 | 2/2006 | Metzger |
| 7,019,604 B2 | 3/2006 | Gotoh et al. |
| 7,019,605 B2 | 3/2006 | Larson et al. |
| 7,057,476 B2 | 6/2006 | Hwu |
| 7,084,553 B2 | 8/2006 | Ludwiczak |
| 7,098,758 B2 | 8/2006 | Wang et al. |
| 7,170,215 B2 | 1/2007 | Namba et al. |
| 7,187,254 B2 | 3/2007 | Su et al. |
| 2002/0000646 A1 | 1/2002 | Gooch et al. |
| 2002/0030424 A1 | 3/2002 | Iwata |
| 2002/0121944 A1 | 9/2002 | Larson, III et al. |
| 2002/0121945 A1 | 9/2002 | Ruby et al. |
| 2002/0152803 A1 | 10/2002 | Larson et al. |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0132493 A1 | 7/2003 | Kang et al. |
| 2003/0141946 A1 | 7/2003 | Ruby et al. |
| 2003/0179053 A1 | 9/2003 | Aigner et al. |
| 2004/0092234 A1 | 5/2004 | Pohjonen |
| 2004/0124952 A1 | 7/2004 | Tikka |
| 2004/0150293 A1 | 8/2004 | Stoemmer |
| 2004/0150296 A1 | 8/2004 | Park et al. |
| 2004/0195937 A1 | 10/2004 | Matsubara et al. |
| 2004/0257172 A1 | 12/2004 | Schmidhammer et al. |
| 2004/0263287 A1 | 12/2004 | Ginsburg et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0093396 A1 | 5/2005 | Larson et al. |
| 2005/0093653 A1 | 5/2005 | Larson, III |
| 2005/0093654 A1 | 5/2005 | Larson, III et al. |
| 2005/0093655 A1 | 5/2005 | Larson, III et al. |
| 2005/0093657 A1 | 5/2005 | Larson et al. |
| 2005/0093658 A1 | 5/2005 | Larson, III et al. |
| 2005/0093659 A1 | 5/2005 | Larson, III et al. |
| 2005/0104690 A1 | 5/2005 | Larson, III et al. |
| 2005/0110598 A1 | 5/2005 | Larson, III |
| 2005/0128030 A1 | 6/2005 | Larson, III et al. |
| 2005/0140466 A1 | 6/2005 | Larson, III et al. |
| 2005/0167795 A1 | 8/2005 | Higashi |
| 2005/0206271 A1 | 9/2005 | Higuchi et al. |
| 2005/0012570 A1 | 10/2005 | Korden et al. |
| 2005/0218488 A1 | 10/2005 | Mie |
| 2006/0087199 A1 | 4/2006 | Larson et al. |
| 2006/0103492 A1 | 5/2006 | Feng et al. |
| 2006/0132262 A1 | 6/2006 | Fazzlo et al. |
| 2006/0164183 A1 | 7/2006 | Tikka et al. |
| 2006/0185139 A1 | 8/2006 | Larson, III |
| 2007/0084964 A1 | 4/2007 | John et al. |
| 2007/0085447 A1 | 4/2007 | Larson |
| 2007/0085631 A1 | 4/2007 | Larson et al. |
| 2007/0085632 A1 | 4/2007 | Larson et al. |
| 2007/0086080 A1 | 4/2007 | Larson et al. |
| 2007/0086274 A1 | 4/2007 | Nishimura et al. |
| 2007/0090892 A1 | 4/2007 | Larson |
| 2007/0170815 A1 | 7/2007 | Unkrich |

OTHER PUBLICATIONS

Yang, C.-M., Highly C-Axis-Oriented AlN Film Using MOCVD for 5GHz-Band FBAR Filter, IEEE Ultrasonics Symposium, Oct. 5, 2003, 99. 170-173.

Krishnaswamy, S.V., et al., "Film Bulk Acoustic Wave Resonatior Technology", Ultrasonic Symposium, 1990, pp. 529-535.

K.M. Lakin et al., "high Performance Stacked Crystal Filter for GPS and Wide Banwidth Applications", 2001 IEEE Ultrasonics Symposium; vol. 1, pp. 833-838, Oct. 7-10, 2001.

Examination Report corresponding to application No. GB0605775.6 dated Aug. 30, 2006.

Jung, Jun-Phil et al., "Experimental And Theoretical Investigation On The Relationship Between AlN Properties And AlN-Based FBAR Characteristics", *2003 IEEE International Frequency Control Symposium and PDA Exhibition Jointly with the 17th European Frequency and Time Forum*, (Sep. 3, 2003), 779-784.

Hadimioglu. B. et al., "Polymer Films As Acoustic Matching Layers". *1990 IEEE Ultrasonics Symposium Proceedings, vol. 2 pp.*, Previously submitted as "Polymer Files As Acoustic Matching Layers, 1990 IEEE Ultrasonics Symposium Proceeding. vol. 4 PP. 1227-1340, Dec. 1990", Considered by Examiner on Mar. 20, 2007, (Dec. 1990), 1337-1340.

Holzlohner, Ronald et al., "Accurate Calculation of Eye Diagrams and Bit Error Rates in Optical Transmission Systems Using Linearization", *Journal of Lightwave Technology*, vol. 20, No. 3, (Mar. 2002), pp. 389-400.

Reinhardt, Alexandre et al., "Design of Coupled Resonator Filters Using Admittance and Scattering Matrices", *2003 IEEE Ultrasonics Symposium*, (May 3, 2003), 1428-1431.

Lakin, K.M. "Coupled Resonator Filters", *2002 IEEE Ultrasonics Symposium*, (Mar. 2, 2002), 901-908.

Lobl, H.P. et al., "Piezoelectric Materials for BAW Resonators and Filters", *2001 IEEE Ultrasonics Symposium*, (Jan. 1, 2001), 807-811.

Lakin, K.M. "Bulk Acoustic Wave Coupled Resonator Filters", *2002 IEEE International Frequency Control Symposium and PDA Exhibition*, (Jan. 2, 2002), 8-14.

U.S. Appl. No. 10/971,169, filed Oct. 22, 2004, Larson, III et al.

"Search report from corresponding application No.", GB0620152.9, (Nov. 15, 2006).

"Search report from corresponding application No.", GB0620655.1, (Nov. 17, 2006).

"Search report from corresponding application No.", GB0620653.6, (Nov. 17, 2006).

"Search report from corresponding application No.", GB0620657.7, (Nov. 23, 2006).

Coombs, Clyde F., et al., "Electronic Instrument Handbook", *Second Edition, McGraw-Hill, Inc.*, (1995), pp. 5.1 to 5.29.

"A partial copy of GB Search Report for", Application No. GB0522393.8, (Jan. 9, 2006), 4 pages.

"A partial copy of GB Search Report for Application No.", GB0525884.3, (Feb. 2, 2006), 4 pgs.

Auld, B. A., "Acoustic Resonators", *Acoustic Fields and Waves in Solids, Second Edition, vol. II*, (1990), 250-259.

"British Search Report Application No.", 0605222.9, (Jul. 11, 2006).

Tiersten, H. F., et al., "An Analysis of Thiskness-Extensional Trapped Energy Resonant Device Structures with Rectangular Electrodes in the Piezoelectric Thin Film on Silicon Configuration", *J. Appl. Phys. 54 (10)*, (Oct. 1983), 5893-5910.

"Search Report from corresponding application", No. GB0605225.2.

"Search Report for Great Britain Patent Application", No. 0617742.2, (Mar. 29, 2007).

"Search Report for Great Britain Patent Application", No. 0617742.2, (Dec. 13, 2006).

"Search Report in the Great Britian Patent Application", No. 0619698.4, (Nov. 30, 2006).

Ruby, R. et al., "The Effect of Perimeter Geometry on FBAR Resonator Electrical Performance", *Microwave Symposium Digest, 2005 IEEE MTT-S International*, (Jun. 12, 2005), 217-221.

Schuessler, Hans H., "Ceramic Filters and Resonators", *Reprinted from IEEE Trans. Sonics Ultrason.*, vol. SU-21, (Oct. 1974), 257-268.

Fattinger, G. G., et al., "Coupled Bulk Acoustic Wave Resonator Filters: Key technology for single-to-balanced RF filters", *0-7803-8331-1/4/W20.00; IEEE MTT-S Digest*, (2004), 927-929.

Choi, Sungjin et al., "Design of Half-Bridge Piezo-Transformer Converters in the AC Adapter Applications", *IEEE 2005*, 244-248.

Li, Yunxiu et al., "AC-DC Converter with Worldwide Range Input Voltage by Series and Parallel Piezoelectric Transformer Connection", *35th Annual IEEE Power Electronics Specialists Conference*, (2004).

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6., (Nov. 2004).

Navas, J. et al., "Miniaturised Battery Charger using Piezoelectric Transformers", *IEEE*, (2001), 492-496.

Jiang, Yimin et al., "A Novel Single-Phase Power Factor Correction Scheme", *IEEE*, (1993), 287-292.

* cited by examiner

METHOD OF MAKING AN ACOUSTICALLY COUPLED TRANSFORMER

CROSS-REFERENCE TO RELATED APPLICATIONS

This application is a divisional of U.S. patent application Ser. No. 10/836,663, filed on Apr. 29, 2004 now U.S. Pat No. 7,091,649, which is a continuation-in-part of U.S. patent application Ser. No. 10/699,481, filed Oct. 30, 2003 now U.S. Pat. No. 6,946,928, and is related to U.S. patent application Ser. No.10/836,653 of Larson III et al. entitled *Film Acoustically-Coupled Transformer with Reverse C-Axis Piezoelectric Material* filed on Apr. 29, 2004, now U.S. Pat. No. 6,987,433 B2 and which is incorporated herein by reference in its entirety.

BACKGROUND

Transformers are used in many types of electronic device to perform such functions as transforming impedances, linking single-ended circuitry with balanced circuitry or vice versa and providing electrical isolation. However, not all transformers have all of these properties. For example, an auto-transformer does not provide electrical isolation.

Transformers operating at audio and radio frequencies up to VHF are commonly built as coupled primary and secondary windings around a high permeability core. Current in the windings generates a magnetic flux. The core contains the magnetic flux and increases the coupling between the windings. A transformer operable in this frequency range can also be realized using an optical-coupler. An opto-coupler used in this mode is referred to in the art as an opto-isolator.

In transformers based on coupled windings or opto-couplers, the input electrical signal is converted to a different form (i.e., a magnetic flux or photons) that interacts with an appropriate transforming structure (i.e., another winding or a light detector), and is re-constituted as an electrical signal at the output. For example, an opto-coupler converts an input electrical signal to photons using a light-emitting diode. The photons pass through an optical fiber or free space that provides isolation. A photodiode illuminated by the photons generates an output electrical signal from the photon stream. The output electrical signal is a replica of the input electrical signal At UHF and microwave frequencies, coil-based transformers become impractical due to such factors as losses in the core, losses in the windings, capacitance between the windings, and a difficulty to make them small enough to prevent wavelength-related problems. Transformers for such frequencies are based on quarter-wavelength transmission lines, e.g., Marchand type, series input/parallel output connected lines, etc. Transformers also exist that are based on micro-machined coupled coils sets and are small enough that wavelength effects are unimportant. However such transformers have issues with high insertion loss.

All the transformers just described for use at UHF and microwave frequencies have dimensions that make them less desirable for use in modem miniature, high-density applications such as cellular telephones. Such transformers also tend to be high in cost because they are not capable of being manufactured by a batch process and because they are essentially an off-chip solution. Moreover, although such transformers typically have a bandwidth that is acceptable for use in cellular telephones, they typically have an insertion loss greater than 1 dB, which is too high.

Opto-couplers are not used at UHF and microwave frequencies due to the junction capacitance of the input LED, non-linearities inherent in the photodetector limited power handling capability and insufficient isolation to give good common mode rejection.

What is needed, therefore, is a transformer capable of providing one or more of the following attributes at electrical frequencies in the range from UHF to microwave: impedance transformation, coupling between balanced and unbalanced circuits and electrical isolation. What is also needed is such a transformer that has a low insertion loss, a bandwidth sufficient to accommodate the frequency range of cellular telephone RF signals, for example, a size smaller than transformers currently used in cellular telephones and a low manufacturing cost.

SUMMARY OF THE INVENTION

In a first aspect, the invention provides an acoustically-coupled transformer having a first stacked bulk acoustic resonator (SBAR) and a second SBAR. Each of the SBARs has a lower film bulk acoustic resonator (FBAR) and an upper FBAR, and an acoustic decoupler between the FBARs. The upper FBAR is stacked atop the lower FBAR. Each FBAR has opposed planar electrodes and a piezoelectric element between the electrodes. The piezoelectric element is characterized by a c-axis. The c-axes of the piezoelectric elements of the lower FBARs are opposite in direction, and the c-axes of the piezoelectric elements of the upper FBARs are opposite in direction. The transformer additionally has a first electrical circuit connecting the lower FBAR of the first SBAR to the lower FBAR of the second SBAR, and a second electrical circuit connecting the upper FBAR of the first SBAR to the upper FBARs of the second SBAR.

In a second aspect, the invention provides a method of making an acoustically-coupled transformer. In the method, a first stacked bulk acoustic resonator (SBAR) and a second SBAR are fabricated. The SBARs are fabricated by forming lower film bulk acoustic resonators (FBARs) and upper FBARs and locating an acoustic decoupler between the lower FBAR and the upper FBAR of each SBAR. Each of the FBARs has opposed planar electrodes and a piezoelectric element between the electrodes. The piezoelectric element is characterized by a c-axis. In forming the FBARs, the c-axes of the piezoelectric elements of the lower FBARs are set opposite in direction, and the c-axes of the upper FBARs are set opposite in direction. Additionally in the method, the lower FBAR of the first SBAR to the lower FBAR of the second SBAR are electrically connected and the upper FBAR of the first SBAR to the upper FBAR of the second SBAR are electrically connected.

In one embodiment, in forming the FBARs, a metal layer is deposited and is patterned to define a pair of the electrodes, and a layer of piezoelectric material is deposited on the electrodes. The c-axes of the piezoelectric elements are set opposite in direction by depositing a seed layer of reverse c-axis piezoelectric material on one of the electrodes prior to depositing the layer of piezoelectric material.

In another embodiment, in forming the FBARs, a metal layer is deposited and is patterned to define a pair of the electrodes, and a layer of piezoelectric material is deposited on the electrodes. The deposited layer has a region of reverse c-axis material on one of the electrodes and a region of normal c-axis material on the other of the electrodes. The c-axes of the piezoelectric elements are set opposite in direction by depositing the regions using different deposition conditions.

In another embodiment, in forming the FBARs, a metal layer is deposited and is patterned to define a pair of first electrodes, a layer of ferroelectric piezoelectric material is deposited over the first electrodes, and an additional metal layer is deposited and is patterned to define pair of second electrodes opposite the first electrodes. The c-axes of the piezoelectric elements are set opposite in direction by applying a poling voltage of a nominal polarity between one of the first electrodes and an opposed one of the second electrodes, and a poling voltage of an opposite polarity between the other of the first electrodes and the other of the second electrodes.

Embodiments of an acoustically-coupled transformer in accordance with the invention are capable of providing one or more of the following attributes at electrical frequencies in the range from UHF to microwave: impedance transformation, coupling between balanced and unbalanced circuits and electrical isolation. Such embodiments typically have a low insertion loss, a bandwidth sufficient to accommodate the frequency range of cellular telephone RF signals, for example, a size smaller than transformers currently used in cellular telephones and a low manufacturing cost.

DETAILED DESCRIPTION

Figure 1A:
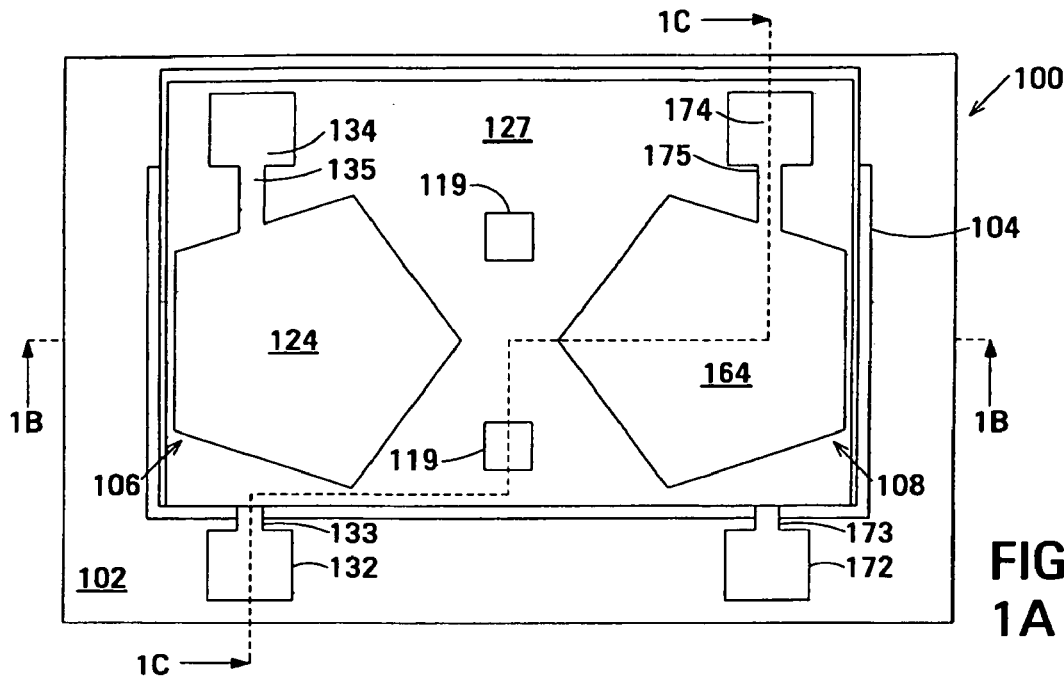
FIG. 1A is a plan view of an example of a first embodiment of a 1:1 acoustically-coupled transformer in accordance with the invention.

Film bulk acoustic resonators (FBARs) are disclosed by Ruby et al. in U.S. patent No. 5,587,620 entitled *Tunable Thin Film Acoustic Resonators and Method of Making Same*, now assigned to the assignee of this disclosure and incorporated in this disclosure by reference. Ruby's disclosure also discloses a stacked film bulk acoustic resonator (SBAR) composed of two layers of piezoelectric material interleaved with three planar electrodes. Ruby's SBAR can be regarded as being composed of a stacked pair of FBARs in which one electrode is common to both FBARs, and will be referred to as a common-electrode SBAR. The common electrode renders the common-electrode SBAR incapable of linking balanced to unbalanced circuits and vice versa and of providing electrical isolation between primary and secondary. Moreover, the common electrode SBAR exhibits an extremely narrow pass bandwidth that makes it unsuitable for use in most applications. The narrow pass bandwidth is the result of the common electrode, which over couples acoustic energy between the FBARs.

U.S. patent application Ser. No. 10/699,481, the application of which this application is a Continuation in Part discloses a thin-film acoustically-coupled transformer composed of a pair of interconnected SBARs in which each of the SBARs incorporates an acoustic decoupler interposed between its constituent FBARs. The acoustic decoupler provides electrical isolation between primary and secondary and eliminates the overcoupling of acoustic energy between the FBARs which gives the thin-film acoustically-coupled transformer a useable bandwidth.

A film bulk acoustic resonator (FBAR) is a polarity-dependent device as a result of polarity dependence of the piezoelectric material that constitutes part of the FBAR. A voltage of a given polarity applied between the electrodes of the FBAR will cause the thickness of the FBAR to change in a first direction, whereas the same voltage of the opposite polarity will cause the thickness of the FBAR to change in a second direction, opposite the first direction. For example, a voltage of the given polarity will cause the thickness of the FBAR to increase whereas a voltage of the opposite polarity will cause the FBAR to decrease. The thickness of the FBAR is the dimension of the FBAR between the electrodes. Similarly, a mechanical stress applied to the FBAR that causes the thickness of the FBAR to change in a first direction will generate a voltage of the given polarity between the electrodes of the FBAR, whereas a mechanical stress that causes the thickness of the FBAR to change in a second direction, opposite the first direction, will generate a voltage of the opposite polarity between the electrodes of the FBAR. For example, a mechanical stress applied to the FBAR that causes the thickness of the FBAR to increase will generate a voltage of the given polarity, whereas a mechanical stress that causes the thickness of the FBAR to decrease will generate a voltage of the opposite polarity.

Piezoelectric materials, such as aluminum nitride (AlN), in the crystal class 6 mm have a hexagonal unit cell with an a-axis and a b-axis in the hexagonal plane and a c-axis orthogonal to the hexagonal plane. The direction of the c-axis of the piezoelectric material of the FBAR determines the relationship between the polarity of the voltage and the direction of change in the thickness of the FBAR. The above examples are obtained using an FBAR in which the piezoelectric material has its c-axis oriented in a given direction. In an FBAR in which the c-axis of the piezoelectric material is oriented in a second direction, opposite the first direction, a voltage of the given polarity applied between the electrodes of the FBAR will cause the thickness of the FBAR to change in the second direction, whereas a voltage of the opposite polarity will cause the thickness of the FBAR to change in a first direction. Similarly, a mechanical stress applied to the FBAR that causes the thickness of the FBAR to change in a first direction will generate a voltage of the opposite polarity between the electrodes of the FBAR whereas a mechanical stress that causes the thickness of the FBAR to change in a second direction, opposite the first direction, will generate a voltage of the given polarity between the electrodes of the FBAR. Piezoelectric material whose c-axis extends towards the substrate over which the FBAR is suspended will be referred to herein as reverse c-axis material. Piezoelectric material whose c-axis extends away from the substrate over which the FBARs are suspended will be referred to herein as normal c-axis material.

Figure 1B:
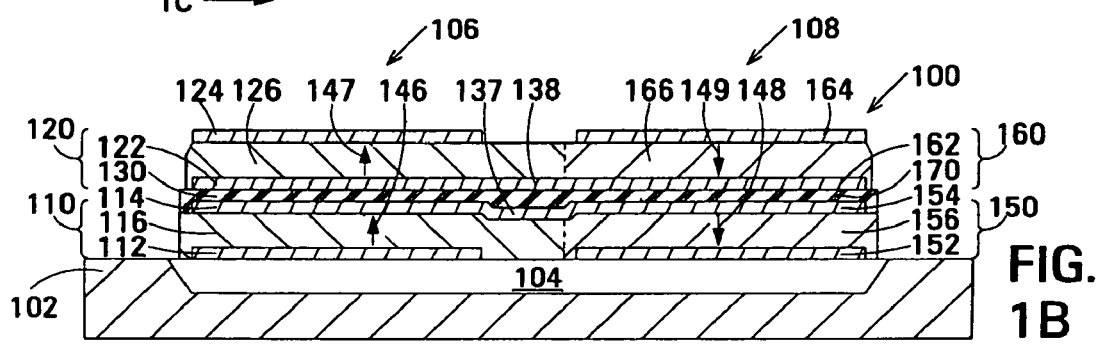
FIGS. 1B and 1C are cross-sectional views of the acoustically-coupled transformer shown in FIG. 1A along the section lines 1B—1B and 1C—1C, respectively.
Figure 1C:
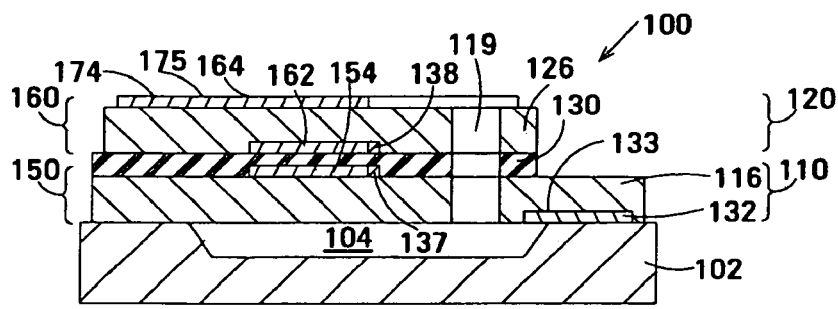

FIGS. 1A–1C show a plan view and two cross-sectional views, respectively, of an exemplary embodiment 100 of a thin-film acoustically-coupled transformer in accordance with the invention. Acoustically-coupled transformer 100 is capable of linking single-ended circuitry with balanced circuitry or vice versa, provides electrical isolation between primary and secondary and is electrically balanced. Acoustically-coupled transformer 100 is a low-impedance transformer having an impedance transformation ratio of 1:1.

Acoustically-coupled transformer 100 is composed of two stacked bulk acoustic resonators (SBARs) 106 and 108. Each SBAR is composed of a lower film bulk acoustic resonator (FBAR) and an upper FBAR and an acoustic decoupler between the FBARs. The upper FBAR is stacked atop the lower FBAR. Transformer 100 is additionally composed of an electrical circuit that connects the lower FBAR of SBAR 106 to the lower FBAR of SBAR 108, and an electrical circuit that connects the upper FBAR of SBAR 106 to the upper FBAR of SBAR 108. SBARs incorporating acoustic decouplers are described in more detail in U.S. patent application Ser. No. 10/699,289 assigned to the assignee of this disclosure and incorporated herein in its entirety by reference.

SBAR 106 is composed of a lower FBAR 110 and an upper FBAR 120 and an acoustic decoupler 130 between FBARs 110 and 120. Upper FBAR 120 is stacked atop lower FBAR 110. Acoustic decoupler 130 controls the coupling of acoustic energy between FBARs 110 and 120. SBAR 108 is composed of a lower FBAR 150 and an upper FBAR 160 and an acoustic decoupler 170 between FBARs 150 and 160. Upper FBAR 160 is stacked atop lower FBAR 150. Acoustic decoupler 170 controls the coupling of acoustic energy between FBARs 150 and 160.

Lower FBAR 110 is composed of opposed planar electrodes 112 and 114 and a piezoelectric element 116 between the electrodes. Upper FBAR 120 is composed of opposed planar electrodes 122 and 124 and a piezoelectric element 126 between the electrodes. Lower FBAR 150 is composed of opposed planar electrodes 152 and 154 and a piezoelectric element 156 between the electrodes. Upper FBAR 160 is composed of opposed planar electrodes 162 and 164 and a piezoelectric element 166 between the electrodes.

SBAR 106 and SBAR 108 are suspended over a cavity 104 defined in a substrate 102. Suspending the SBARs over a cavity allows the FBARs of the SBARs to resonate mechanically. Other suspension schemes that allow the FBARs to resonate mechanically are possible. For example, the SBARs can be located over a mismatched acoustic Bragg reflector (not shown) formed in or on substrate 102, as disclosed by Lakin in U.S. patent No. 6,107,721, the disclosure of which is incorporated into this disclosure by reference.

In the example shown, the piezoelectric elements are each composed of a respective layer of piezoelectric material. The piezoelectric material has a c-axis. Thus, each of piezoelectric elements 116, 126, 156, 166 is characterized by a respective c-axis. The c-axes of the piezoelectric elements 116 and 156 of lower FBARs 110 and 150, respectively, are opposite in direction and the c-axes of the piezoelectric elements 126 and 166 of upper FBARs 120 and 160, respectively, are opposite in direction.

In the example shown, the piezoelectric material of piezoelectric element 156 of lower FBAR 150 and the piezoelectric material of piezoelectric element 166 of upper FBAR 160 are reverse c-axis material. The directions of the c-axes of piezoelectric elements 156 and 166 are indicated by arrows 148 and 149, respectively. The piezoelectric material of the piezoelectric element 116 of lower FBAR 110 and the piezoelectric material of the piezoelectric element 126 of upper FBAR 120 is normal c-axis material. The directions of the c-axes of piezoelectric elements 116 and 126 are indicated by arrows 146 and 147, respectively.

In another embodiments, the piezoelectric material of the piezoelectric elements 126 and 156 of FBARs 120 and 150, respectively, is reverse c-axis material and the piezoelectric elements 116 and 166 of the piezoelectric elements of FBARs 110 and 160 is normal c-axis material. Alternatively, the piezoelectric material of the piezoelectric elements 126 and 156 of FBARs 120 and 150, respectively, is reverse c-axis material and the piezoelectric elements 116 and 166 of the piezoelectric elements of FBARs 110 and 160 is normal c-axis material. In a further alternative, the piezoelectric material of the piezoelectric elements 116 and 126 of FBARs 110 and 120, respectively, is reverse c-axis material and the piezoelectric elements 156 and 166 of the piezoelectric elements of FBARs 150 and 160 is normal c-axis material. In a final alternative, the piezoelectric material of the piezoelectric elements 116 and 166 of FBARs 110 and 160, respectively, is reverse c-axis material and the piezoelectric elements 126 and 156 of the piezoelectric elements of FBARs 120 and 150 is normal c-axis material.

Figure 2:
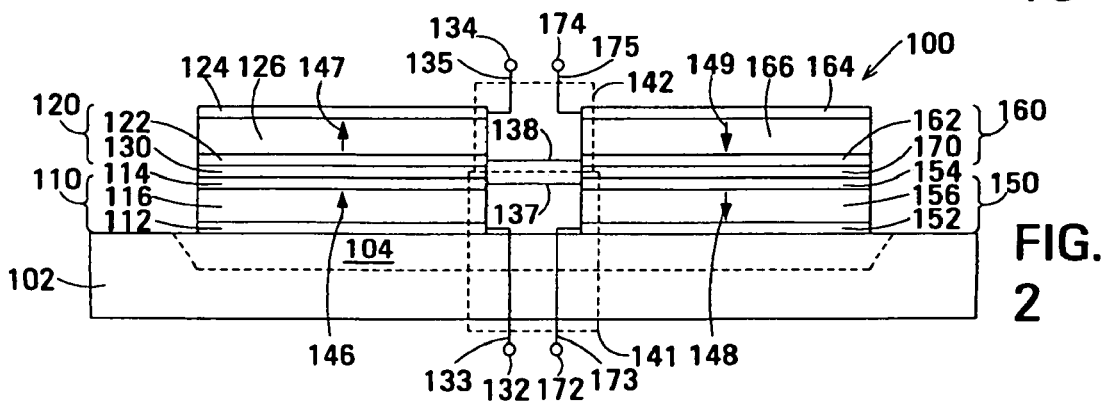
FIG. 2 is a schematic drawing of the electrical circuits of the acoustically-coupled transformer shown in FIGS. 1A–1C.

FIG. 2 is a schematic drawing of the electrical circuits of acoustically-coupled transformer 100. A first electrical circuit 141 is composed of an electrical trace 137 that connects electrode 154 of lower FBAR 150 to electrode 114 of lower FBAR 110. Thus, electrical circuit 141 connects lower FBARs 110 and 150 in series. However, since the direction of the c-axis of piezoelectric element 156 of lower FBAR 150 is reversed relative to that of lower FBAR 110, FBARs 110 and 150 connected in series have the same electromechanical properties as conventional FBARs connected in anti-series. First electrical circuit 141 is additionally composed of an electrical trace 133 that electrically connects electrode 112 to a terminal 132, and an electrical trace 173 that electrically connects electrodes 152 to a terminal 172. Terminals 132 and 172 are structured as bonding pads. The terms series and anti-series are described further below.

A second electrical circuit 142 is composed of an electrical trace 138 that electrically connects electrode 122 of upper FBAR 120 of SBAR 106 to electrode 162 of upper FBAR 160 of SBAR 108. Second electrical circuit 142 is additionally composed of an electrical trace 135 that electrically connects electrode 124 to a terminal 134, and an electrical trace 175 that electrically connects electrode 164 to a terminal 174. Thus, electrical circuit 142 electrically connects the upper FBARs in series. However, since the direction of the c-axis of piezoelectric element 166 of upper FBAR 160 is reversed relative to that of upper FBAR 120, FBARs 120 and 160 connected in series have the same electromechanical properties as conventional FBARs connected in anti-series. Terminals 134 and 174 are structured as bonding pads.

In an embodiment, terminals 132 and 172 constitute the primary terminals and the terminals 134 and 174 constitute the secondary terminals of thin-film acoustically-coupled transformer 100. So connected, acoustically-coupled transformer 100 operates as a 1:1 transformer. A signal applied to primary terminals 132 and 172 is output at the same level at secondary terminals 134 and 174. Also, in a typical embodiment in which all of the FBARs 110, 120, 150 and 160 have a similar characteristic impedance, the impedance seen between primary terminals 132 and 172 is that of two FBARs in series, i.e., twice the typical characteristic impedance of a single FBAR, and the impedance seen between secondary terminals 134 and 174 is also that of two FBARs in series. Thus, acoustically-coupled transformer 100 has a 1:1 primary-to-secondary impedance ratio.

In an alternative embodiment, terminals 132 and 172 constitute the secondary terminals and terminals 134 and 174 constitute the primary terminals of thin-film acoustically-coupled transformer 100. So connected, acoustically-coupled transformer 100 still operates as a 1:1 transformer, and outputs a signal at secondary terminals 134 and 174 at the same level as that of the signal applied to primary terminals 132 and 172, and the primary-to-secondary impedance ratio is 1:1.

Electrical circuit 141 electrically connects lower FBARs 110 and 150 in series so that an input electrical signal applied to terminals 132 and 172 is applied equally and in antiphase to FBARs 110 and 150. An electrical signal applied to terminals 132 and 172 that causes FBAR 110 to contract mechanically also causes FBAR 150 to expand mechanically by the same amount, and vice versa, due to the opposed directions of the c-axes of piezoelectric elements 116 and 156 of FBARs 110 and 150, respectively. The acoustic energy generated by FBAR 150 is therefore in phase with the acoustic energy generated by FBAR 110. Consequently, the acoustic energy received by FBAR 160 from FBAR 150 is in phase with the acoustic energy received by FBAR 120 from FBAR 110. The in-phase acoustic signals applied to the piezoelectric elements 126 and 166 of upper FBARs 120 and 160, respectively, generates electrical signals between electrodes 122 and 124 and between 162 and 164 that are in antiphase with one another due to opposite directions of the c-axes of piezoelectric elements 126 and 166. Electrical circuit 142 connects FBARs 120 and 160 in series so that the voltage difference between terminals 134 and 174 is equal to twice the voltage across each of upper FBARs 120 and 160.

As noted above, in transformer 100 in accordance with the invention, acoustic decoupler 130 controls the coupling of acoustic energy between stacked FBARs 110 and 120 and acoustic decoupler 170 controls the coupling of acoustic energy between stacked FBARs 150 and 160. Additionally, acoustic decouplers 130 and 170 are electrically insulating, so acoustic decoupler 130 electrically isolates FBAR 110 from FBAR 120, and acoustic decoupler 170 electrically isolates FBAR 150 from FBAR 160. The electrical isolation provided by acoustic decouplers 130 and 170 provides electrical isolation between the primary and the secondary of thin-film acoustically-coupled transformer 100.

The acoustic coupling provided by acoustic decouplers 130 and 170 is substantially less than the acoustic coupling between the FBARs in the common electrode SBAR referred to above. As a result, FBARs 110 and 120 and FBARs 150 and 160 are not over coupled, and transformer 100 has a relatively flat response in the pass band, as will be described below with reference to FIG. 5.

The embodiment of the acoustic decouplers 130 and 170 shown in FIGS. 1A–1C is a first embodiment in which acoustic decoupler 130 is composed of layer of acoustic decoupling material located between the electrode 114 of lower FBAR 110 and the electrode 122 of upper FBAR 120, and acoustic decoupler 170 is composed of layer of acoustic decoupling material located between the electrode 154 of lower FBARs 150 and the electrode 162 of upper FBAR 160.

Figure 3A:
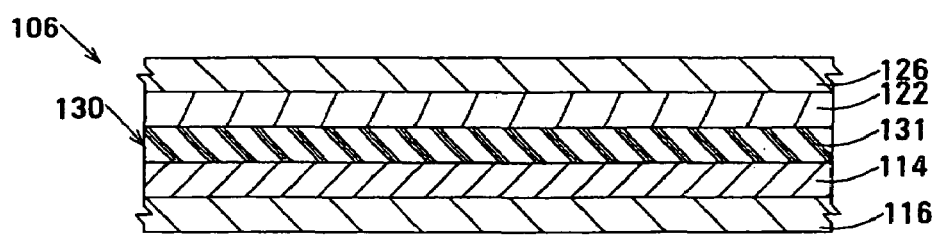
FIG. 3A is an enlarged cross-sectional view of part of the acoustically-coupled transformer shown in FIG. 1A along the section line 1B–3B showing a first embodiment of the acoustic decoupler.

FIG. 3A is an enlarged view showing in more detail part of SBAR 106 incorporating the above-mentioned first embodiment of acoustic decoupler 130. Referring additionally to FIGS. 1A and 1B, the corresponding part of SBAR 108 and acoustic decoupler 170 are similar in structure and will not be independently described. In the example shown, acoustic decoupler 130 is composed of a layer 131 of acoustic decoupling material located between the electrode 114 of FBAR 110 and electrode 122 of FBAR 120. Layer 131 of acoustic decoupling material additionally extends between the electrode 144 of FBAR 150 and electrode 162 of FBAR 160 to provides the acoustic decoupling layer 170 of SBAR 108. In other embodiments, independent but similar layers of acoustic decoupling material provide acoustic decouplers 130 and 170, respectively.

Important properties of the acoustic decoupling material of layer 131 are an acoustic impedance significantly different from, and typically significantly less than that of the materials of FBARs 110, 120, 150 and 160, and a nominal thickness that is an odd integral multiple of one quarter of the wavelength in the acoustic decoupling material of an acoustic wave having a frequency equal to the center frequency of the pass band of acoustically-coupled transformer 100. In some applications, a high electrical resistivity is also desirable. In embodiments in which the material of layer 131 is electrically insulating, a low dielectric permittivity is also desirable.

The acoustic decoupling material has an acoustic impedance less that of the materials of the FBARs 110, 120, 150 and 160 and substantially greater than that of air. The acoustic impedance of a material is the ratio of stress to particle velocity in the material and is measured in Rayleighs, abbreviated as rayl. The materials of the FBARs are typically aluminum nitride (AlN) as the material of piezoelectric layers 116, 126, 156 and 166 and molybdenum (Mo) as the material of electrodes 112, 114, 122, 124, 152, 154, 162 and 164. The acoustic impedances of the materials of the FBARs are typically greater than 30 Mrayl (35 Mrayl for AlN and 63 Mrayl for Mo) and the acoustic impedance of air is about 1 krayl. In embodiments of transformer 100 in which the materials of the FBARs are as stated above, materials with an acoustic impedance in the range from about 1 Mrayl to about 16 Mrayl work well as the acoustic coupling material of layer 131.

Figure 4:
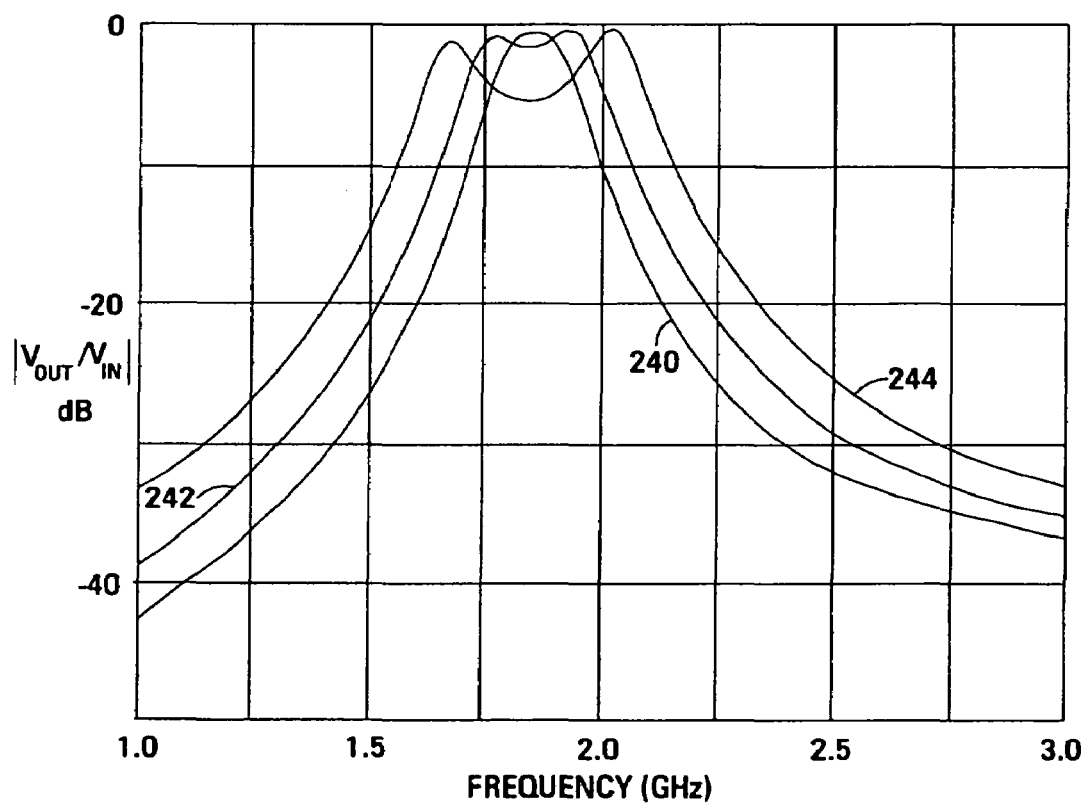
FIG. 4 is a graph showing how the calculated frequency response of embodiments of the thin-film acoustically-coupled transformer shown in FIGS. 1A–1C depends on the acoustic impedance of the acoustic decoupler.

FIG. 4 is a graph showing how the calculated frequency response of thin-film acoustically-coupled transformer 100 depends on the acoustic impedance of the acoustic decoupling material of layer 131 that constitutes the first embodiment of acoustic decouplers 130 and 170. The embodiment illustrated has a center frequency of about 1.9 GHZ. Calculated frequency responses for embodiments in which the acoustic decoupling material of the acoustic decoupler has acoustic impedances of about 4 Mrayl (polyimide—curve 240), 8 Mrayl (curve 242) and 16 Mrayl (curve 244) are shown. It can be seen that the bandwidth of transformer 100 increases with increasing acoustic impedance of the acoustic decoupling material. In the embodiment in which the acoustic impedance is 16 Mrayl, the resonances of the FBARs are over coupled, which causes the characteristic double peak in the pass band response.

In the embodiment of thin-film acoustically-coupled transformer 100 shown in FIGS. 1A–1C, the thickness of the layer 131 (FIG. 3A) of acoustic decoupling material that constitutes acoustic decouplers 130 and 170 has a nominal thickness equal to one quarter of the wavelength in the acoustic decoupling material of an acoustic wave having a frequency equal to the center frequency of the transformer's pass band, i.e., $t \approx \lambda_n/4$, where t is the thickness of layer 131 and $\lambda_n$ is the wavelength in the acoustic decoupling material of an acoustic wave having a frequency equal to the center frequency of the pass band of transformer 100. A thickness of layer 131 within approximately ±10% of the nominal thickness can alternatively be used. A thickness outside this range can alternatively be used with some degradation in performance. However, the thickness of layer 131 should differ significantly from $0\lambda_n$, at one extreme and $\lambda_n/2$ at the other extreme.

More generally, layer 131 of acoustic decoupling material has a nominal thickness equal to an odd integral multiple of one quarter of the wavelength in the acoustic decoupling material of an acoustic wave having a frequency equal to the center frequency of the pass band of transformer 100, i.e., $t \approx (2m+1)\lambda_n/4$, where t and $\lambda_n$ are as defined above and m is an integer equal to or greater than zero. In this case, a thickness of layer 131 that differs from the nominal thickness by approximately ±10% of $\lambda_n/4$ can alternatively be used. A thickness tolerance outside this range can be used with some degradation in performance, but the thickness of layer 131 should differ significantly from an integral multiple of $\lambda_n/2$.

Many plastic materials have acoustic impedances in the range stated above and can be applied in layers of uniform thickness in the thickness ranges stated above. Such plastic materials are therefore potentially suitable for use as the acoustic decoupling material of layer 131 that constitutes acoustic decouplers 130 and 170. However, the acoustic decoupling material must also be capable of withstanding the temperatures of the fabrication operations performed after layer 131 has been deposited on electrodes 114 and 154 to form acoustic decouplers 130 and 170.

As will be described in more detail below, in practical embodiments of thin-film acoustically-coupled transformer 100, electrodes 122, 124 162 and 164 and piezoelectric layers 126 and 166 are deposited by sputtering after layer 131 has been deposited. Temperatures as high as 300° C. are reached during these deposition processes. Thus, a plastic that remains stable at such temperatures is desirable as the acoustic decoupling material of layer 131.

Plastic materials typically have a very high acoustical attenuation per unit length compared with the other materials of SBARs 106 and 108. However, since the thickness of layer 131 of plastic acoustic decoupling material is typically less than 1 μm, the acoustic attenuation introduced by acoustic decouplers 130 and 170 is typically negligible.

In one embodiment, polyimide is used as the acoustic decoupling material of layer 131. Polyimide is sold under the trademark Kaptong® by E. I. du Pont de Nemours and Company. In such embodiment, acoustic decouplers 130 and 170 are composed of layer 131 of polyimide applied to electrodes 114 and 154 by spin coating, spraying, dipping or another suitable method. Polyimide has an acoustic impedance of about 4 Mrayl. In another embodiment, a poly(para-xylylene) is used as the acoustic decoupling material of layer 131. In such embodiment, acoustic decouplers 130 and 170 are composed of layer 131 of poly(para-xylylene) applied to electrodes 114 and 154 by vacuum deposition. Poly(para-xylylene) is also known in the art asparylene. The dimer precursor di-para-xylylene from which parylene is made and equipment for performing vacuum deposition of layers of parylene are available from many suppliers. Parylene has an acoustic impedance of about 1.8 Mrayl.

In an alternative embodiment, the acoustic decoupling material of layer 131 has an acoustic impedance substantially greater than the materials of FBARs 110, 120, 150 and 160. No materials having this property are known at this time, but such materials may become available in future, or lower acoustic impedance FBAR materials may become available in future. The thickness of layer 131 of such high acoustic impedance acoustic decoupling material is as described above.

Figure 3B:
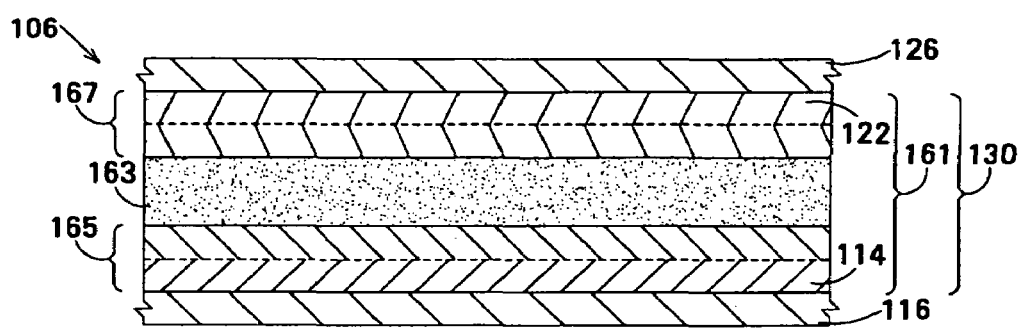
FIG. 3B is an enlarged cross-sectional view of part of the acoustically-coupled transformer shown in FIG. 1A along the section line 1B—1B showing a second embodiment of the acoustic decoupler.

FIG. 3B is an enlarged view showing in more detail part of SBAR 106 incorporating a second embodiment of acoustic decoupler 130 that incorporates a Bragg structure 161. The corresponding part of SBAR 108 incorporating such second embodiment of acoustic decoupler 170 is similar in structure and will not be independently described. Bragg structure 161 is composed of a low acoustic impedance Bragg element 163 sandwiched between high acoustic impedance Bragg elements 165 and 167. Low acoustic impedance Bragg element 163 is a layer of a low acoustic impedance material whereas high acoustic impedance Bragg elements 165 and 167 are each a layer of high acoustic impedance material. The acoustic impedances of the Bragg elements are characterized as "low" and "high" with respect to one another and additionally with respect to the acoustic impedance of the piezoelectric material of piezoelectric elements 116 and 126. At least one of the Bragg elements additionally has a low dielectric permittivity. In some applications, at least one of the Bragg elements additionally has a high electrical resistivity to provide electrical insulation between primary and secondary.

Each of the layers constituting Bragg elements 161, 163 and 165 has a nominal thickness equal to an odd integral multiple of one quarter of the wavelength in the material of the layer of an acoustic wave having a frequency equal to the center frequency of transformer 100. Layers that differ from the nominal thickness by approximately ±10% of one quarter of the wavelength can alternatively be used. A thickness tolerance outside this range can be used with some degradation in performance, but the thickness of the layers should differ significantly from an integral multiple of one-half of the wavelength.

In an embodiment, low acoustic impedance Bragg element 163 is a layer of silicon dioxide ($SiO_2$), which has an acoustic impedance of about 13 Mrayl, and each of the high acoustic impedance Bragg elements 165 and 167 is a layer of the same material as electrodes 114 and 122, respectively, i.e., molybdenum, which has an acoustic impedance of about 63 Mrayl. Using the same material for high acoustic impedance Bragg elements 165 and 167 and electrodes 114 and 122, respectively, of FBARs 110 and 120, respectively, allows high acoustic impedance Bragg elements 165 and 167 additionally to serve as electrodes 114 and 122, respectively.

In an example, high acoustic impedance Bragg elements 165 and 167 have a nominal thickness equal to one quarter of the wavelength in molybdenum of an acoustic wave having a frequency equal to the center frequency of the pass band of transformer 100, and low acoustic impedance Bragg element 163 had a nominal thickness equal to three quarters of the wavelength in $SiO_2$ of an acoustic wave having a frequency equal to the center frequency of the pass band of the transformer. Using a three-quarter wavelength-thick layer of $SiO_2$ instead of a one-quarter wavelength thick layer of $SiO_2$ as low acoustic impedance Bragg element 163 reduces the capacitance between FBARs 110 and 120, but reduces the bandwidth of transformer 100.

In embodiments in which the acoustic impedance difference between high acoustic impedance Bragg elements 165 and 167 and low acoustic impedance Bragg element 163 is relatively low, Bragg structure 161 may be composed of more than one (e.g., n) low acoustic impedance Bragg elements interleaved with a corresponding number (i.e., n+1) of high acoustic impedance Bragg elements. For example, the Bragg structure may be composed of two low acoustic impedance Bragg element interleaved with three high acoustic impedance Bragg elements. Only one of the Bragg elements need be insulating.

In an embodiment, low acoustic impedance Bragg element 163 additionally extends between the electrodes 154 and 162 of SBAR 108 and provide parts of acoustic decouplers 130 and 170. Additionally, electrodes 154 and 162 have nominal thicknesses equal to one quarter of the wavelength in the electrode material of an acoustic wave having a frequency equal to the center frequency of the pass band of transformer 100. Alternatively, acoustic decouplers 130 and 170 may incorporate respective independent but similar low acoustic impedance Bragg elements.

Thousands of thin-film acoustically-coupled transformers similar to thin-film acoustically-coupled transformer 100 are fabricated at one time by wafer-scale fabrication. Such wafer-scale fabrication makes thin-film acoustically-coupled transformer 100 inexpensive to fabricate. An exemplary fabrication method will be described next with reference to the plan views of FIGS. 5A–5L and the cross-sectional views of FIGS. 5M–5X. The quantitative examples set forth below relate to an example of thin-film acoustically-coupled transformer 100 suitable for operation at a frequency of about 1.9 GHz. Examples suitable for operation at other frequencies will differ in such details as electrode areas and film thicknesses.

A wafer (not shown) of single-crystal silicon is provided. A portion of the wafer constitutes, for each transformer being fabricated, a substrate corresponding to the substrate 102 of transformer 100. FIGS. 5A–5L and FIGS. 5M–5X illustrate, and the following description describes, the fabrication of transformer 100 in and on a portion of the wafer. As transformer 100 is fabricated, the remaining transformers on the wafer are similarly fabricated.

Figure 5A:
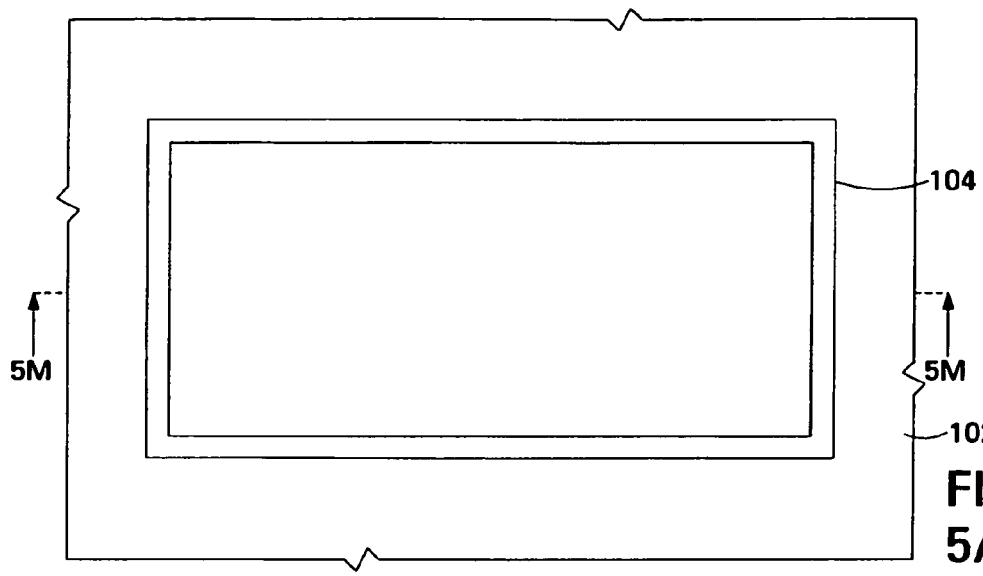
FIGS. 5A–5L are plan views illustrating an exemplary process for making an acoustically-coupled transformer in accordance with the invention.
Figure 5M:
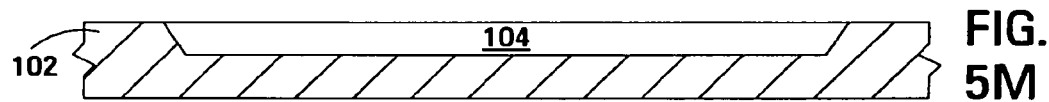
FIGS. 5M–5X are cross-sectional views along the section lines 5M—5M, 5N—5N, 5O—5O, 5P—5P, 5Q—5Q, 5R—5R, 5S—5S, 5T—5T, 5U—5U, 5V—5V, 5W—5W and 5X—5X, in FIGS. 5A–5L, respectively.

The portion of the wafer that constitutes substrate 102 of transformer 100 is selectively wet etched to form cavity 104, as shown in FIGS. 5A and 5M. Cavity 104 may alternatively be formed by dry etching.

Figure 5B:
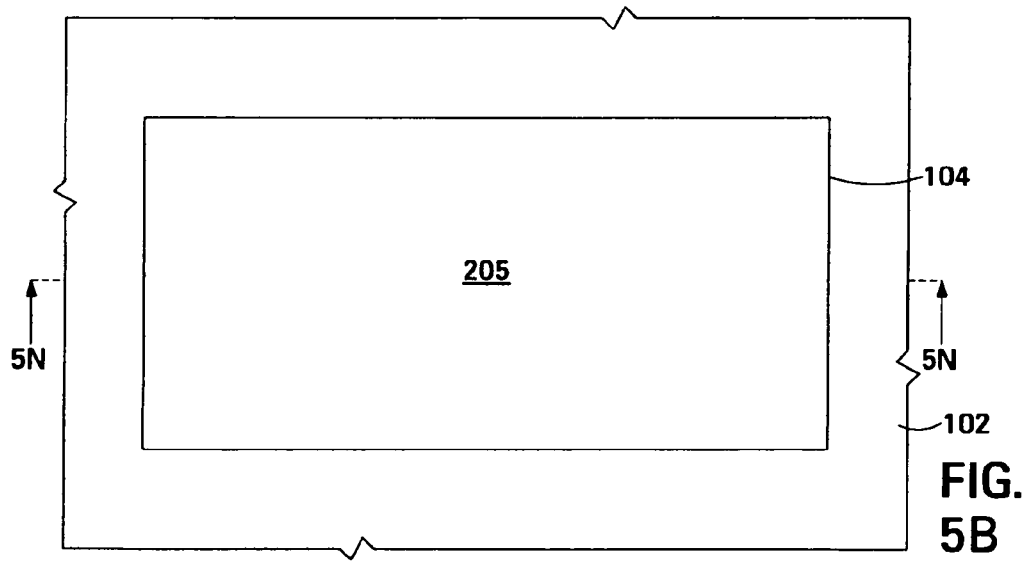
Figure 5N:
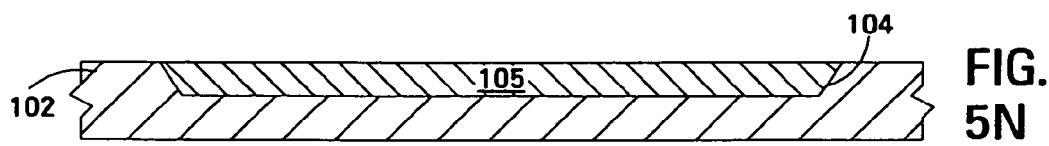

A layer of fill material (not shown) is deposited on the surface of the wafer with a thickness sufficient to fill the cavities: The surface of the wafer is then planarized to leave the cavity filled with the fill material. FIGS. 5B and 5N show cavity 104 in substrate 102 filled with fill material 105.

In an embodiment, the fill material was phosphosilicate glass (PSG) and was deposited using conventional low-pressure chemical vapor deposition (LPCVD). The fill material may alternatively be deposited by sputtering or by spin coating.

Figure 5C:
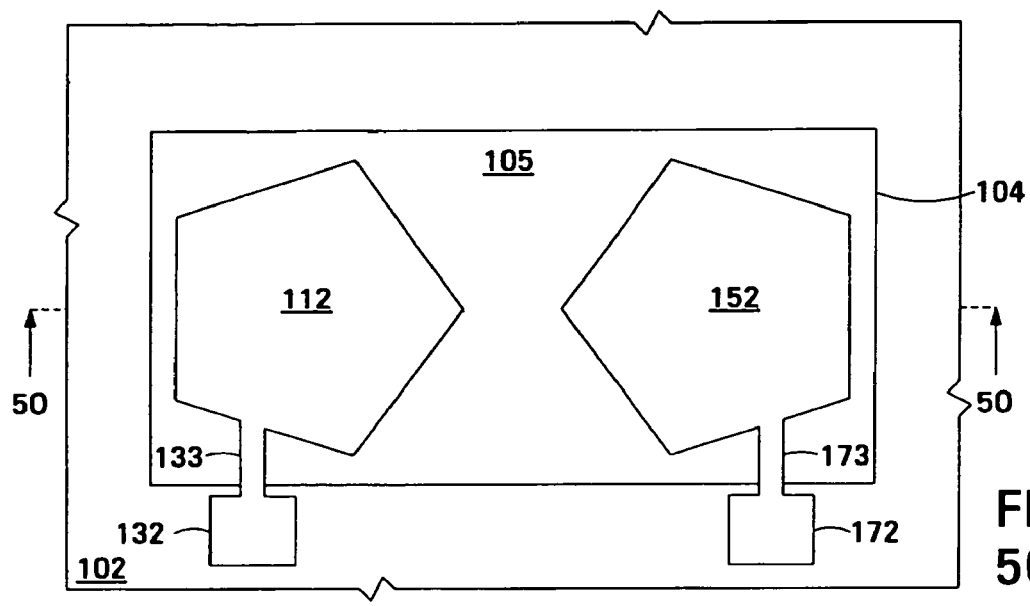
Figure 5O:
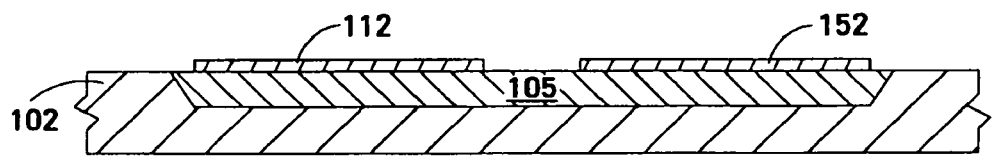

A layer of metal is deposited on the surface of the wafer and the fill material. The metal is patterned to define electrode 112, electrode 152, bonding pad 132 and electrical trace 133 extending between electrode 112 and bonding pad 132, bonding pad 172 and electrical trace 173 extending between electrode 152 and bonding pad 172, as shown in FIGS. 5C and 5O. Electrode 112 and electrode 152 are located so that part of the surface of fill material 105 remains exposed to enable the fill material to be removed later by etching, as will be described below.

Electrode 112 and electrode 152 typically have an irregular shape in a plane parallel to the major surface of wafer 302. An irregular shape minimizes lateral modes in the FBARs of which the electrodes form part, as described in U.S. Pat. No. 6,215,375 of Larson III et al., the disclosure of which is incorporated herein by reference.

Electrodes 112, 114, 122, 124, 152, 154, 162 and 164 are formed by patterning metal layers such that, in respective planes parallel to the major surface of the wafer, electrodes 112 and 114 of FBAR 110 have the same shape, size, orientation and position, electrodes 122 and 124 of FBAR 120 have the same shape, size, orientation and position, electrodes 152 and 154 of FBAR 150 have the same shape, size, orientation and position and electrodes 162 and 164 of FBAR 160 have the same shape, size, orientation and position. Typically, electrodes 114 and 122 additionally have the same shape, size, orientation and position and electrodes 154 and 162 additionally have the same shape, size, orientation and position.

In an embodiment, the metal deposited to form electrode 112, bonding pad 132, trace 133, electrode 152, bonding pad 172 and trace 173 was molybdenum. The molybdenum was deposited with a thickness of about 440 nm by sputtering, and was patterned by dry etching to define pentagonal electrodes each with an area of about 7,000 square µm. The area of the electrodes is chosen to provide a given electrical impedance. The impedance also depends on the height of SBARs 106 and 108 and the operating frequency. Other refractory metals such as tungsten, niobium and titanium may alternatively be used as the material of electrodes 112 and 152, bonding pads 132 and 172 and traces 133 and 173. The electrodes, bonding pads and traces may alternatively comprise layers of more than one material.

Figure 5D:
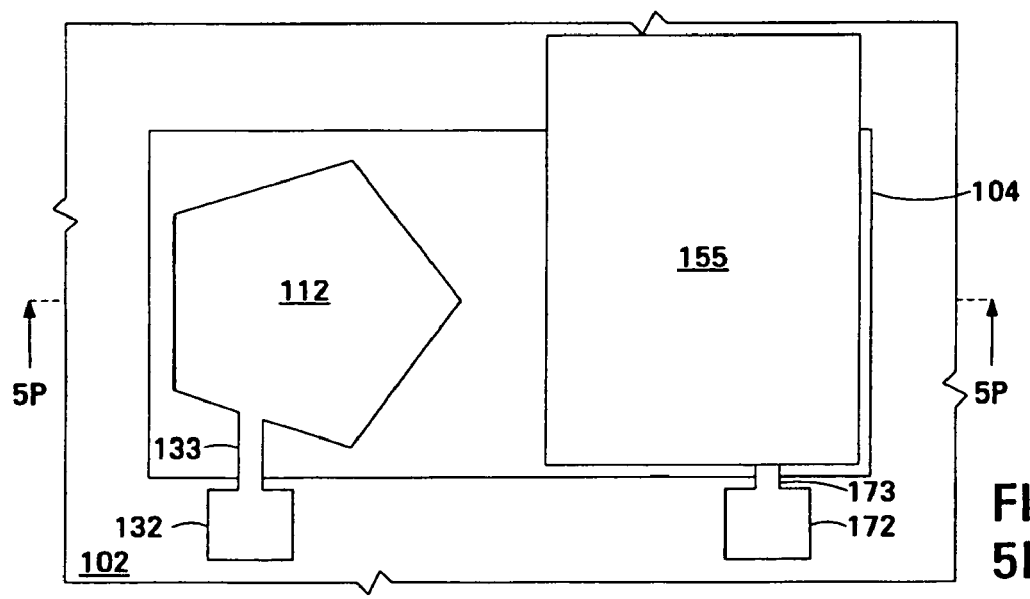
Figure 5P:
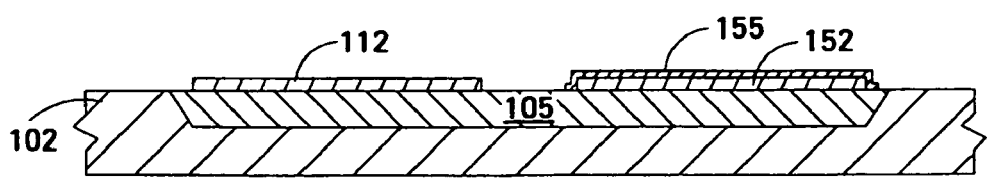
Figure 5E:
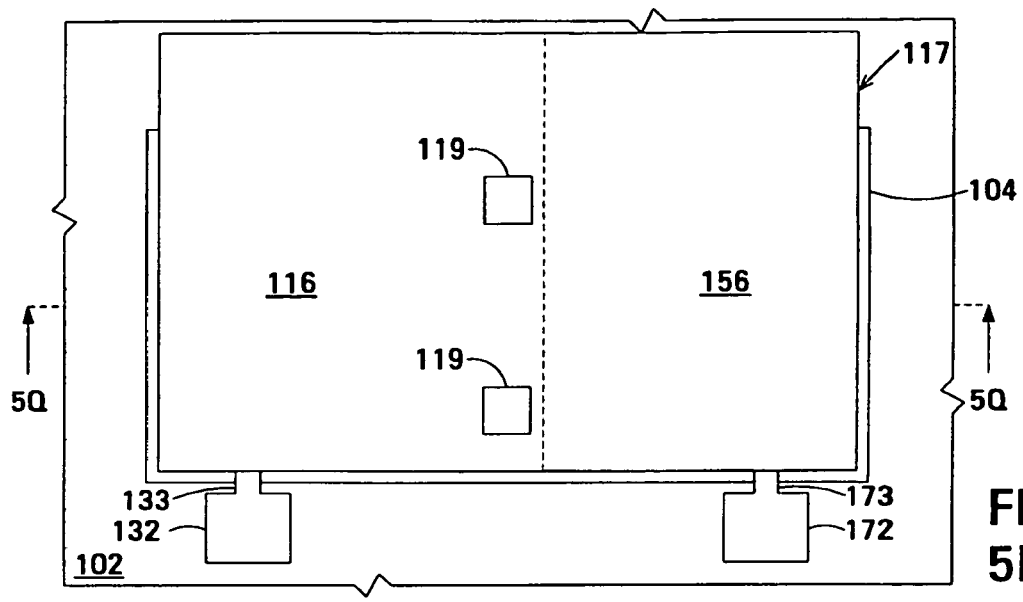
Figure 5Q:
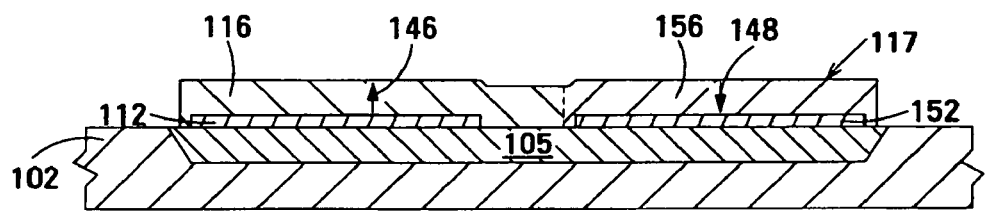

Piezoelectric material is deposited and is patterned to define a piezoelectric layer 117 that provides normal c-axis piezoelectric element 116 of FBAR 110 and reverse c-axis piezoelectric element 156 of FBAR 150. The piezoelectric material is deposited by first depositing a thin layer of reverse c-axis piezoelectric material and patterning the thin layer to define seed layer 155 over electrode 152, as shown in FIGS. 5D and 5P. Then, a thick layer of piezoelectric material having a nominal thickness equal to the design thickness of piezoelectric elements 116 and 156 is deposited and is patterned to define piezoelectric layer 117, as shown in FIGS. 5E and 5Q. Seed layer 155 remains in place under part of layer 117 but is not shown in FIG. 5Q due to its negligible thickness compared with layer 117. Piezoelectric layer 117 is patterned to expose part of the surface of fill material 105 and bonding pads 132 and 172. Piezoelectric layer 117 is additionally patterned to define windows 119 that provide access to additional parts of the surface of the fill material.

Referring again to FIGS. 5D and 5P, the thin layer of piezoelectric material that is patterned to define seed layer 155 is deposited under deposition conditions that promote the formation of reverse c-axis piezoelectric material. Patterning the thin layer of piezoelectric material to define seed layer 155 exposes electrode 112, part of the surface of fill material 105, bonding pad 132, electrical trace 173, bonding pad 172 and part of electrical trace 173.

Referring now to FIGS. 5E and 5Q, the thick layer of piezoelectric material is deposited under normal deposition conditions. The piezoelectric material of the thick layer grows with the direction of its c-axis reversed in the portion deposited on seed layer 155 but with its c-axis in the normal direction elsewhere. Patterning the thick layer of piezoelectric material to define piezoelectric layer 117, which provides piezoelectric element 116 and piezoelectric element 156, exposes part of the surface of fill material 105, bonding pad 132 and part of electrical trace 133, bonding pad 172 and part of electrical trace 173, and additionally forms windows 119 that provide access to additional parts of the surface of the fill material.

In an embodiment, the thin layer of piezoelectric material was aluminum nitride and was deposited with a thickness of about 40 nm by sputtering in an oxygen-rich sputtering environment. Although this deposition process could be used to deposit the entire thickness of piezoelectric layer 117, the resulting piezoelectric material typically has piezoelectric properties inferior to those of piezoelectric material grown under normal growth conditions. By depositing a thin layer of reverse c-axis material under oxygen-rich growth conditions as a seed layer, then depositing a thick layer of piezoelectric material under normal, nitrogen-rich growth conditions, the reverse c-axis piezoelectric material deposited on the seed layer has piezoelectric properties comparable with those of normal c-axis piezoelectric material. Thus, depositing layer 117 of piezoelectric material forms piezoelectric element 116 with its c-axis (indicated by arrow 146) in the normal direction and piezoelectric element 156 with its c-axis (indicated by arrow 148) in the reverse direction.

The thin layer of piezoelectric material was patterned to define seed layer 155 by wet etching in potassium hydroxide or by chlorine-based dry etching.

In an embodiment, the piezoelectric material deposited to form piezoelectric layer 117 was aluminum nitride and was deposited with a thickness of about 760 nm by sputtering. The piezoelectric material was patterned by wet etching in potassium hydroxide or by chlorine-based dry etching. Alternative materials for piezoelectric layer 117 include zinc oxide, cadmium sulfide and poled ferroelectric materials such as perovskite ferroelectrics including lead zirconium titanate, lead meta niobate and barium titanate. Poling of ferroelectric materials is described below with reference to FIGS. 7A–7F.

Figure 5F:
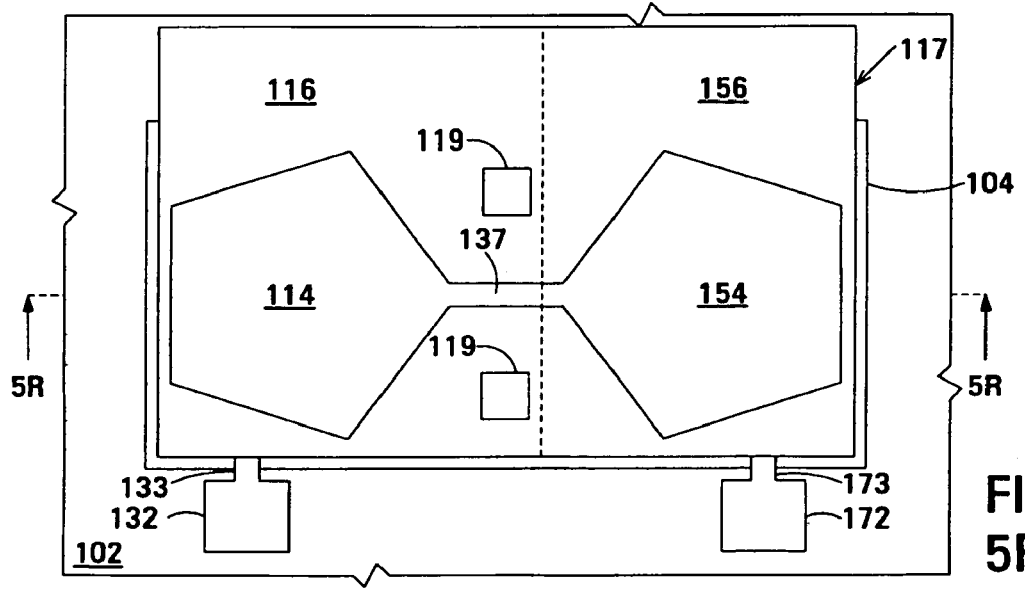
Figure 5R:
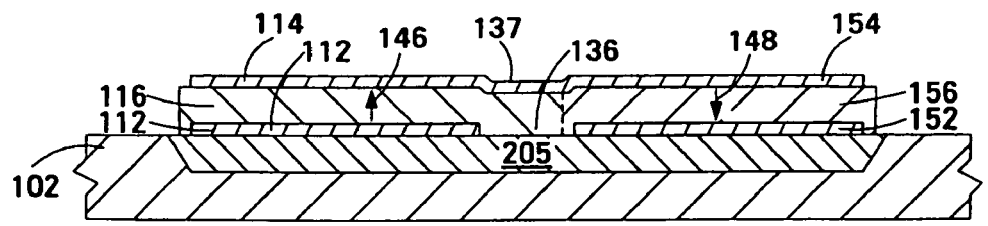

A layer of metal is deposited and is patterned to define electrode 114, electrode 154 and electrical trace 137 extending between electrode 114 and electrode 154, as shown in FIGS. 5F and 5R.

In an embodiment, the metal deposited to form electrode 114, electrode 154 and trace 137 was molybdenum. The molybdenum was deposited with a thickness of about 440 nm by sputtering, and was patterned by dry etching. Other refractory metals may alternatively be used as the material of electrodes 114 and 154 and trace 137. The electrodes and trace may alternatively comprise layers of more than one material.

Figure 5G:
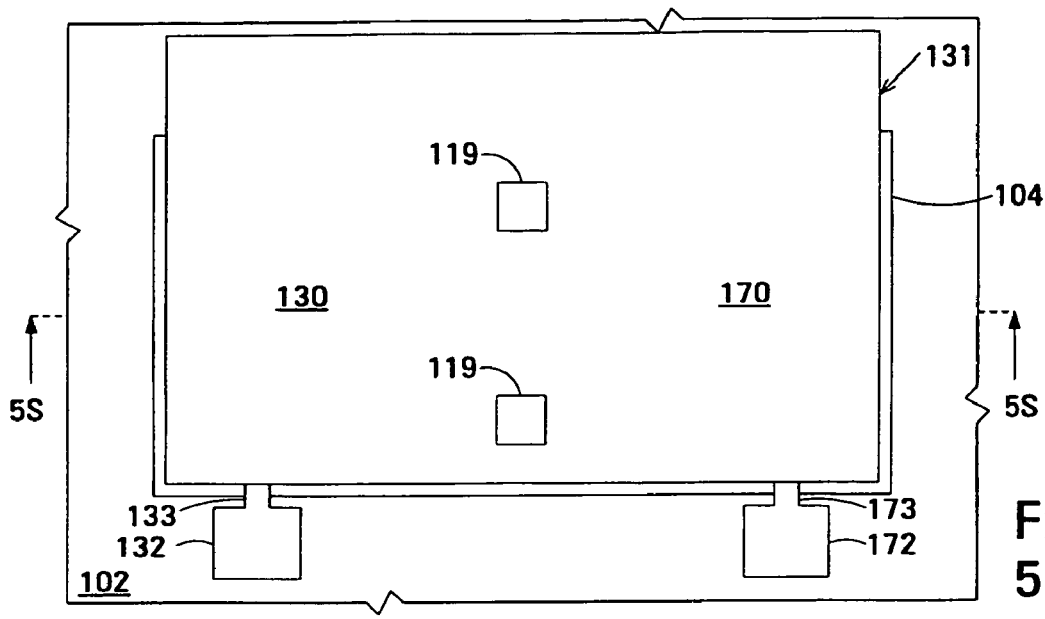
Figure 5S:
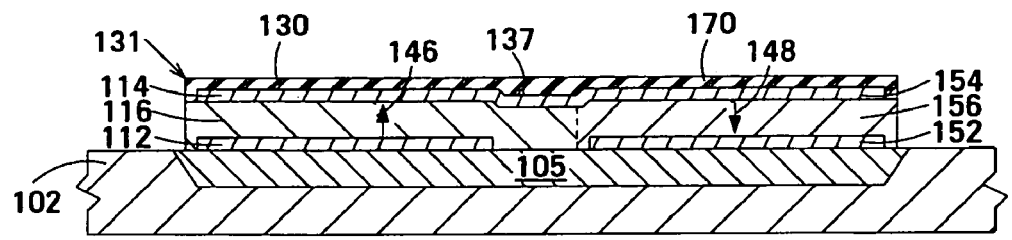

A layer of acoustic decoupling material is then deposited and is patterned to define an acoustic decoupling layer 131 that provides acoustic decoupler 130 and acoustic decoupler 170, as shown in FIGS. 5G and 5S. Acoustic decoupling layer 131 covers at least electrode 114 and electrode 154 (FIG. 5F), and is patterned to expose part of the surface of fill material 105 and bonding pads 132 and 172. Acoustic decoupling layer 131 is additionally patterned to define windows 119 that provide access to additional parts of the surface of the fill material.

In an embodiment, the acoustic decoupling material was polyimide with a thickness of about 750 nm, i.e., three quarters of a center frequency wavelength of 1.9 GHz in the polyimide. The polyimide was deposited to form acoustic decoupling layer 131 by spin coating, and was patterned by photolithography. Polyimide is photosensitive so that no photoresist is needed. As noted above, other plastic materials can be used as the acoustic decoupling material. The acoustic decoupling material can be deposited by methods other than spin coating.

In an embodiment in which the material of the acoustic decoupling layer 131 was polyimide, after deposition and patterning of the polyimide, the wafer was baked at about 300° C. before further processing was performed. The bake evaporates volatile constituents of the polyimide and prevents the evaporation of such volatile constituents during subsequent processing from causing separation of subsequently-deposited layers.

Figure 5H:
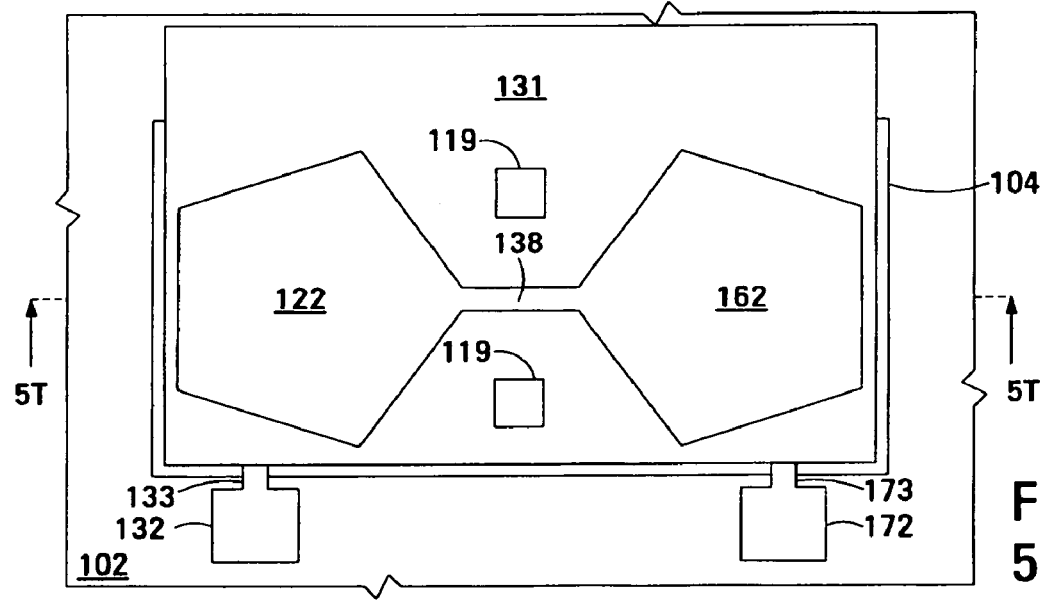
Figure 5T:
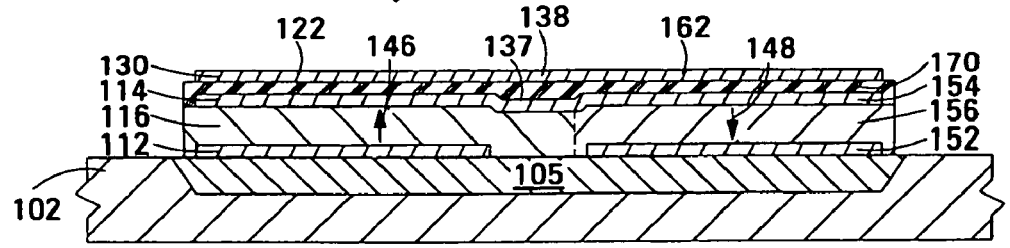

A layer of metal is deposited and is patterned to define electrode 122, electrode 162 and electrical trace 138 extending from electrode 122 to electrode 162, as shown in FIGS. 5H and 5T.

In an embodiment, the metal deposited to form electrodes 122 and 162 and electrical trace 138 was molybdenum. The molybdenum was deposited with a thickness of about 440 nm by sputtering, and was patterned by dry etching. Other refractory metals may alternatively be used as the material of electrodes 122 and 162 and electrical trace 138. The electrodes and trace may alternatively comprise layers of more than one material.

Figure 5I:
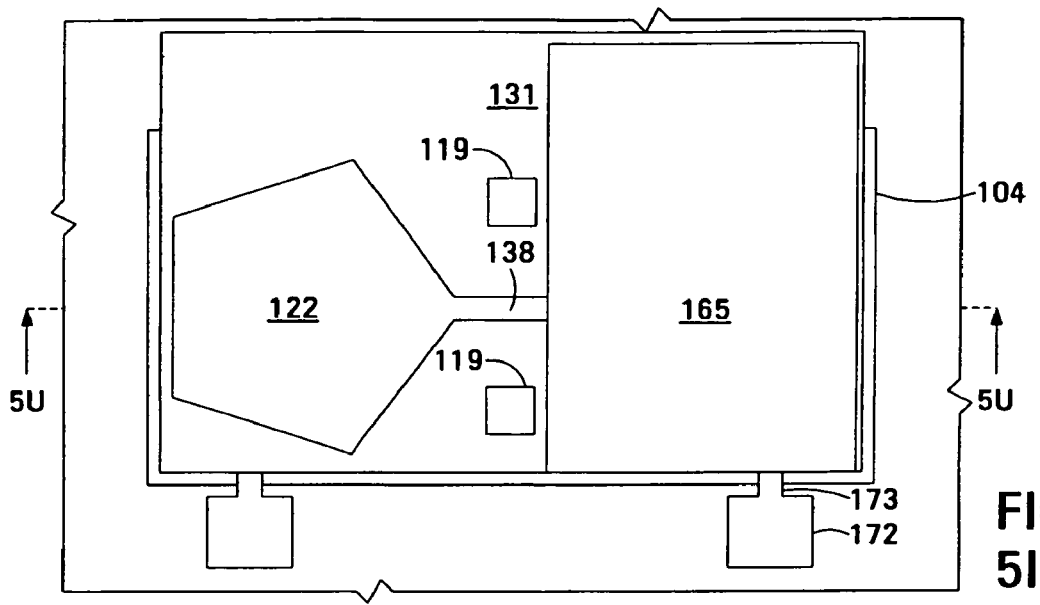
Figure 5U:
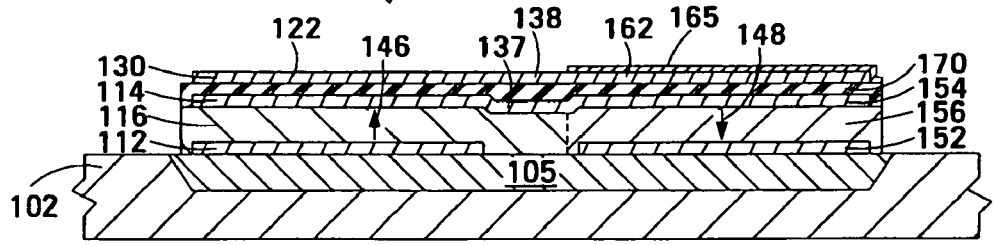
Figure 5J:
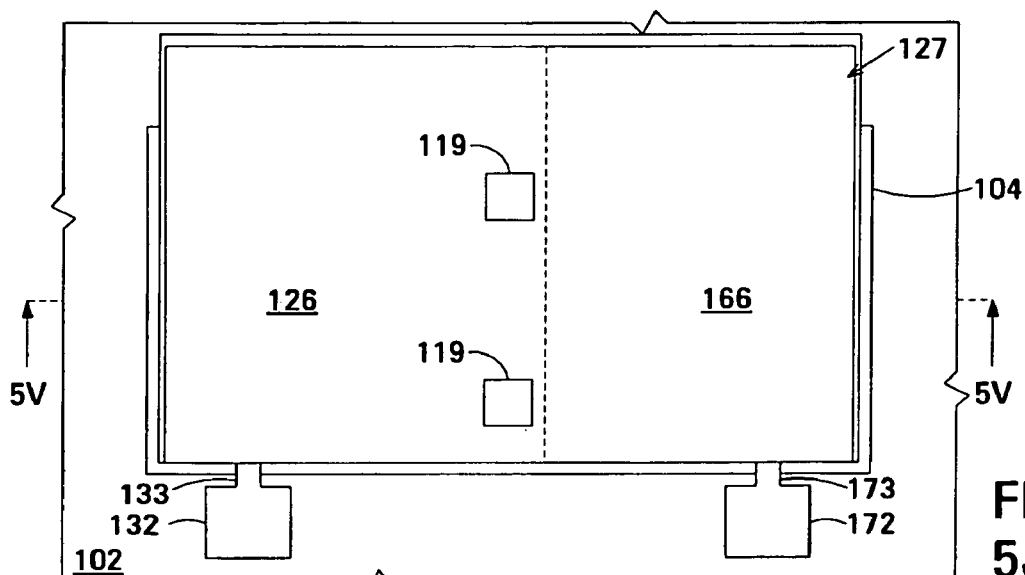
Figure 5V:
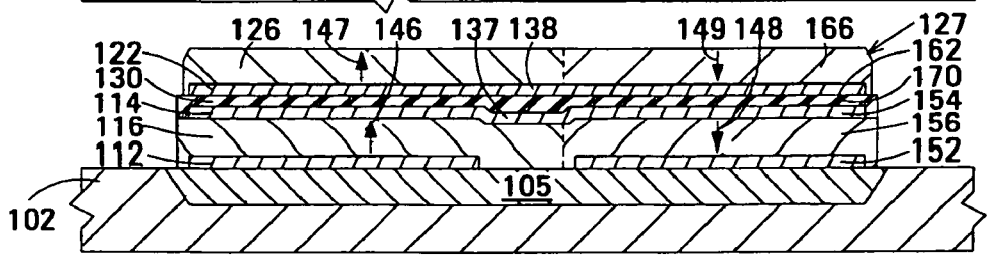

Piezoelectric material is deposited and is patterned to define a piezoelectric layer 127 that provides normal c-axis piezoelectric element 126 of FBAR 120 and reverse c-axis piezoelectric element 166 of FBAR 160. The piezoelectric material is deposited by first depositing a thin layer of reverse c-axis piezoelectric material and patterning the thin layer to define a seed layer 165 over electrode 162, as shown in FIGS. 5I and 5U. Then, a thick layer of piezoelectric material having a nominal thickness equal to the design thickness of piezoelectric elements 126 and 166 is deposited and is patterned to define piezoelectric layer 127, as shown in FIGS. 5J and 5V. Seed layer 165 remains in place under part of layer 127 but is not shown in FIG. 5V due to its negligible thickness compared with layer 127. Piezoelectric layer 127 is patterned to expose part of the surface of fill material 105 and bonding pads 132 and 172. Piezoelectric layer 127 is additionally patterned to define windows 119 that provide access to additional parts of the surface of the fill material.

Referring again to FIGS. 5I and 5U, the thin layer of piezoelectric material that is patterned to define seed layer 165 is deposited under deposition conditions that promote the formation of reverse c-axis piezoelectric material. Patterning the thin layer of piezoelectric material to define seed layer 165 exposes electrode 122, part of the surface of fill material 105, bonding pad 132, part of electrical trace 133, part of electrical trace 138 adjacent electrode 122, bonding pad 172 and part of electrical trace 173.

Referring now to FIGS. 5J and 5V, the thick layer of piezoelectric material is deposited under normal deposition conditions. The piezoelectric material of the thick layer grows with the direction of its c-axis reversed in the portion deposited on seed layer 165 but with its c-axis in the normal direction elsewhere. Patterning the thick layer of piezoelectric material to define piezoelectric layer 127, which provides piezoelectric element 126 and piezoelectric element 166, exposes part of the surface of fill material 105, bonding pad 132 and part of electrical trace 133, bonding pad 172 and part of electrical trace 173, and additionally forms windows 119 that provide access to additional parts of the surface of the fill material.

In an embodiment, the thin layer of piezoelectric material was aluminum nitride and was deposited with a thickness of about 40 nm by sputtering in an oxygen-rich sputtering environment. Alternatively this deposition process could be used to deposit the entire thickness of piezoelectric layer 127, as described above.

The thin layer of piezoelectric material was patterned to define seed layer 165 by wet etching in potassium hydroxide or by chlorine-based dry etching.

In an embodiment, the piezoelectric material deposited to form piezoelectric layer 127 was aluminum nitride and was deposited with a thickness of about 760 nm by sputtering. The piezoelectric material was patterned by wet etching in potassium hydroxide or by chlorine-based dry etching. Alternative materials for piezoelectric layer 127 include zinc oxide, cadmium sulfide and poled ferroelectric materials such as perovskite ferroelectric materials including lead zirconium titanate, lead meta niobate and barium titanate. Poling of ferroelectric materials is described below with reference to FIGS. 7A–7F.

Figure 5K:
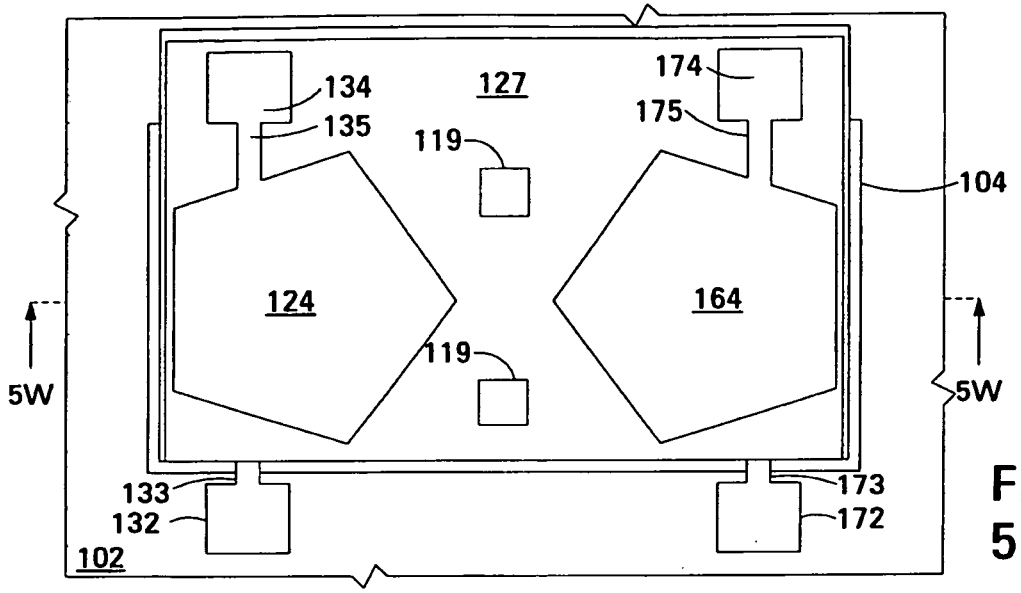
Figure 5W:
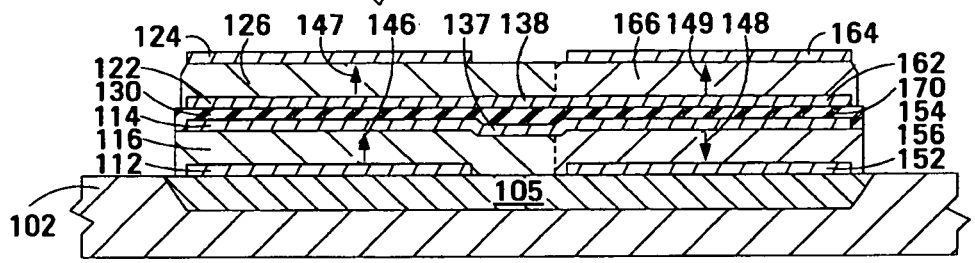

A layer of metal is deposited and is patterned to define electrode 124, electrode 164, bonding pad 134, electrical trace 135 extending from electrode 124 to bonding pad 134, bonding pad 174 and electrical trace 175 extending from electrode 164 to bonding pad 174, as shown in FIGS. 5K and 5W.

In an embodiment, the metal deposited to form electrodes 124 and 164, bonding pads 134 and 174 and electrical traces 135 and 175 was molybdenum. The molybdenum was deposited with a thickness of about 440 nm by sputtering, and was patterned by dry etching. Other refractory metals such may alternatively be used as the material of electrodes 124 and 164, bonding pads 134 and 174 and electrical traces 135 and 175. The electrodes, bonding pads and traces may alternatively comprise layers of more than one material.

A gold protective layer (not shown) is then deposited on the exposed surfaces of bonding pads 132, 134, 172 and 174.

Figure 5L:
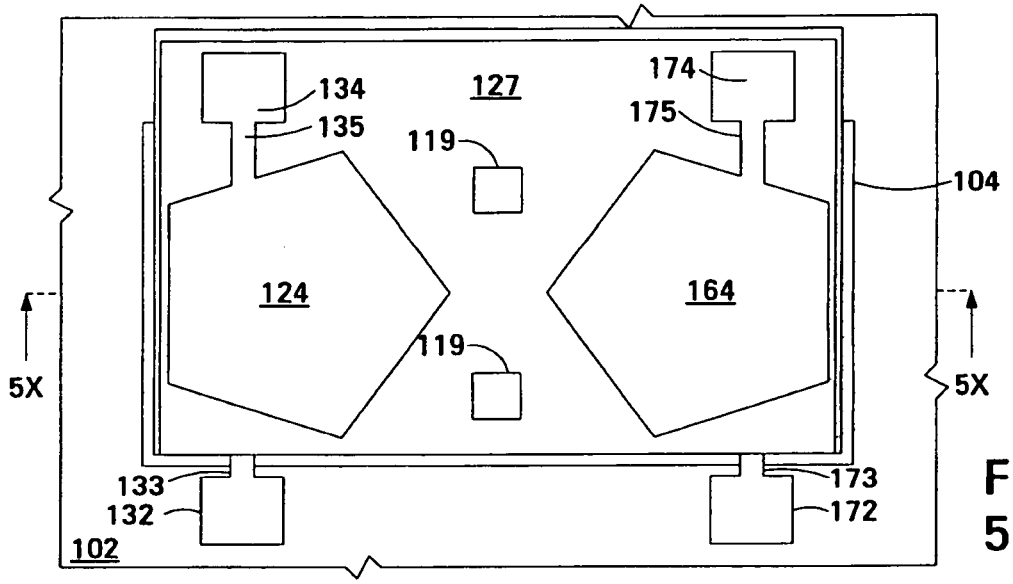
Figure 5X:
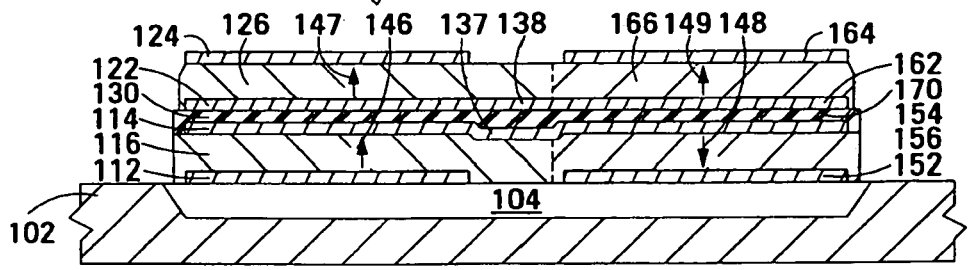

The wafer is then isotropically wet etched to remove fill material 105 from cavity 104. As noted above, portions of the surface of fill material 105 remain exposed through, for example, windows 119. The etch process leaves thin-film acoustically-coupled transformer 100 suspended over cavity 104, as shown in FIGS. 5L and 5X.

In an embodiment, the etchant used to remove fill material 105 was dilute hydrofluoric acid.

The wafer is then divided into individual thin-film acoustically-coupled transformers, including transformer 100. Each transformer is then mounted in a package and electrical connections are made between bonding pads 132, 172, 134 and 174 of the transformer and pads that are part of the package.

In use, bonding pad 132 electrically connected to electrode 112 and bonding pad 172 electrically connected to electrode 152 and provide the first terminals of the transformer 100, and bonding pad 172 electrically connected to electrode 124 and bonding pad 174 electrically connected to electrode 154 provide the second terminals of transformer 100. In one embodiment, the first terminals provide the primary terminals and the second terminals provide the secondary terminals of thin-film acoustically-coupled transformer 100. In another embodiment, the first terminals provide the secondary terminals and the second terminals provide the primary terminals of thin-film acoustically-coupled transformer 100.

The invention has been described above with reference to an embodiment in which layers of reverse c-axis piezoelectric material constitute piezoelectric element 156 of FBAR 150 and piezoelectric element 166 of FBAR 160. However, this is not critical to the invention: reverse c-axis piezoelectric material may constitute the piezoelectric element of either of the upper FBARs 120 and 160 and the piezoelectric element of either of the lower FBARs 110 and 150.

An embodiment of thin-film acoustically-coupled transformer 100 in which acoustic decouplers 130 and 170 incorporate a Bragg structure similar to that described above with reference to FIG. 3B is made by a process similar to that described above. The process differs as follows:

After layer 117 of piezoelectric material has been deposited and patterned (FIGS. 5D, 5E, 5P and 5Q), a layer of metal is deposited and is patterned in a manner similar to that shown in FIGS. 5F and 5Q to define high acoustic impedance Bragg elements incorporating electrodes 114 and 154, respectively, and additionally to define electrical trace 137 extending between the electrodes. The high acoustic impedance Bragg elements are each similar to high acoustic impedance Bragg element 165 shown in FIG. 3B. The layer of metal is deposited with a nominal thickness equal to an odd, integral multiple of one quarter of the wavelength in the metal of an acoustic wave having a frequency equal to the center frequency of the pass band of transformer 100.

In an embodiment, the metal deposited to form the high acoustic impedance Bragg elements respectively incorporating electrodes 114 and 154 is molybdenum. The molybdenum is deposited with a thickness of about 820 nm (one-quarter wavelength in Mo at about 1.9 GHz) by sputtering, and is patterned by dry etching. Other refractory metals may alternatively be used as the material of the high acoustic impedance Bragg elements respectively incorporating electrodes 114 and 154. The high acoustic impedance Bragg elements may alternatively comprise layers of more than one metal.

A layer of low acoustic impedance material is then deposited and is patterned in a manner similar to that shown in FIGS. 5G and 5S to define a low acoustic impedance Bragg element. The layer of low acoustic impedance material is deposited with a nominal thickness equal to an odd, integral multiple of one quarter of the wavelength in the low acoustic impedance material of an acoustic wave having a frequency equal to the center frequency of the pass band of transformer 100. The low acoustic impedance Bragg element covers at least the high acoustic impedance Bragg elements, and is additionally patterned to expose part of the surface of fill material 105 and bonding pads 132 and 172. The layer of low acoustic impedance material is additionally patterned to define windows 119 that provide access to additional parts of the surface of the fill material.

In an embodiment, the low acoustic impedance material is $SiO_2$ with a thickness of about 790 nm. The $SiO_2$ is deposited by sputtering, and is patterned by etching. Other low acoustic impedance material that can be used as the material of low acoustic impedance Bragg element include phosphosilicate glass (PSG), titanium dioxide and magnesium fluoride. The low acoustic impedance material can alternatively be deposited by methods other than sputtering.

A layer of metal is deposited and is patterned in a manner similar to that shown in FIGS. 5H and 5T to define high acoustic impedance Bragg elements respectively incorporating electrodes 122 and 162. The layer of metal is additionally patterned to define an electrical trace 138 extending from electrode 122 to electrode 162. The layer of metal is deposited with a nominal thickness equal to an odd, integral multiple of one quarter of the wavelength in the metal of an acoustic wave having a frequency equal to the center frequency of the pass band of transformer 100.

In an embodiment, the metal deposited to form a high acoustic impedance Bragg elements respectively incorporating electrodes 122 and 162 is molybdenum. The molybdenum is deposited with a thickness of about 820 nm (one-quarter wavelength in Mo) by sputtering, and is patterned by dry etching. Other refractory metals may alternatively be used as the material of the high acoustic impedance Bragg elements respectively incorporating electrodes 122 and 162 and electrical trace 138. The high acoustic impedance Bragg elements, pads and electrical traces may alternatively comprise layers of more than one material.

Fabrication of transformer 100 is then completed using the processes described above with reference to FIGS. 5I–5L and 5U–5X.

Figure 6A:
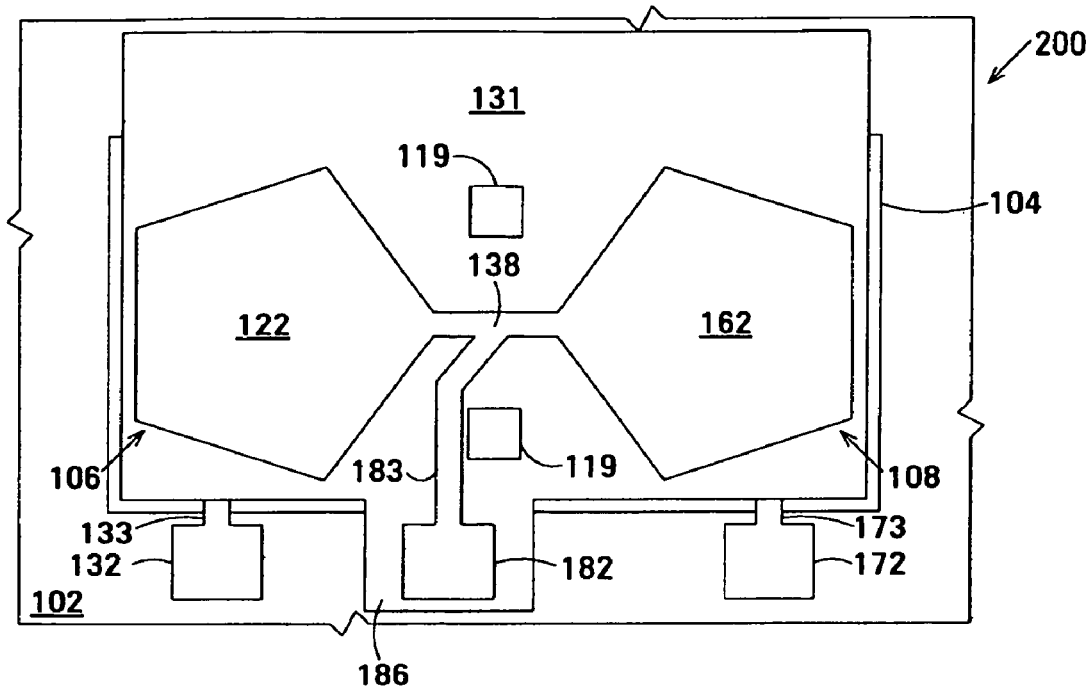
FIG. 6A is a plan view of a second embodiment of a 1:1 acoustically-coupled transformer in accordance with the invention part-way through its fabrication.

In some embodiments of an thin-film acoustically-coupled transformer in accordance with the invention, one or both of electrical circuits 141 and 142 (FIG. 2) has an additional center tap terminal. FIG. 6A shows a second embodiment 200 of a thin-film acoustically-coupled transformer in accordance with the invention part-way through its fabrication. In the example of thin-film acoustically-coupled transformer 200 shown, electrical circuit 142 has a center tap terminal. Elements of thin-film acoustically-coupled transformer 200 that correspond to elements of thin-film acoustically-coupled transformer 100 described above with reference to FIGS. 1A–1C and 2 are indicated by the same reference numerals and will not be described again in detail.

FIG. 6A shows thin-film acoustically-coupled transformer 200 at the stage of its fabrication corresponding to that described above with reference to FIGS. 5H and 5T. In the processes described above with reference to FIGS. 5E, 5Q, 5G and 5S, piezoelectric layer 117 and layer 131 of acoustic decoupling material are patterned additionally to define a support region 186. After layer 131 has been deposited and patterned as described above with reference to FIGS. 5G and 5S, a metal layer is deposited and is patterned to define electrode 122, electrode 162 and electrical trace 138 extending between electrodes 122 and 162, as described above. The metal layer is additionally patterned to define a bonding pad 182 and an electrical trace 183 extending between electrical trace 138 and bonding pad 182. Bonding pad 182 is located on support region 186 and provides the center tap terminal of electrical circuit 241.

In an embodiment, the metal deposited was molybdenum with a thickness of about 440 nm. The metal was deposited by sputtering and was patterned by dry etching. Other refractory metals may alternatively be used. Electrodes 122 and 162, electrical traces 138 and 183 and bonding pad 182 may alternatively comprise layers of more than one material.

Fabrication of thin-film acoustically-coupled transformer 200 is completed substantially as described above with reference to FIGS. 5I, 5U, 5J, 5V, 5K, 5W, 5L and 5X, except that piezoelectric layer 127 is additionally patterned to expose bonding pad 182.

Figure 6B:
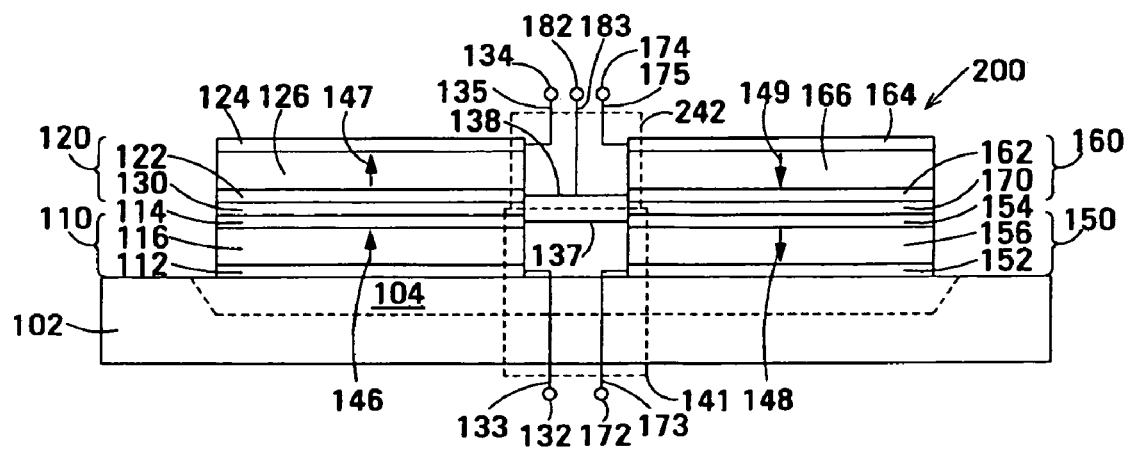
FIG. 6B is a schematic drawing of the electrical circuits of the acoustically-coupled transformer shown in FIG. 6A.

FIG. 6B is a schematic drawing of the electrical circuits of acoustically-coupled transformer 200. First electrical circuit 141 is described above. A second electrical circuit 242 is composed of electrical trace 138 that electrically connects electrode 122 of upper FBAR 120 of SBAR 106 to electrode 162 of upper FBAR 160 of SBAR 108. Second electrical circuit 242 is additionally composed of electrical trace 135 that electrically connects electrode 124 to terminal 134, electrical trace 175 that electrically connects electrode 164 to terminal 174, and electrical trace 183 that connects electrical trace 138 to terminal 182. Thus, electrical circuit 242 electrically connects the upper FBARs in series and provides a center tap connection.

A bonding pad similar to bonding pad 182 and an electrical trace similar to trace 183 but connecting to trace 137 may additionally or alternatively be defined in the metal layer deposited and patterned in the process described above with reference to FIGS. 5F and 5R to provide a center tap terminal in electrical circuit 141 (FIG. 6B).

Fabrication of a thin-film acoustically-coupled transformer in accordance with the invention is described above with reference to an example in which piezoelectric elements with reverse c-axes and having good piezoelectric properties are deposited under normal deposition conditions on a thin seed layer of reverse c-axis piezoelectric material deposited under deposition conditions that promote the formation of reverse c-axis material. As noted above, an entire layer of reverse c-axis material may alternatively be deposited under deposition conditions that promote the formation of reverse c-axis material.

In such a method, the processes described above with reference to FIGS. 5A and 5M, 5B and 5N, and 5C and 5O are performed. A layer of piezoelectric material having a thickness equal to the design thickness of piezoelectric element 116 (FIG. 2) is then deposited under deposition conditions that promote the formation of normal c-axis material. The normal c-axis piezoelectric material is then patterned to define piezoelectric element 116. The patterning exposes electrode 152, bonding pad 132, part of electrical trace 133, bonding pad 172, electrical trace 173 and additionally defines windows 119 that provide access to additional parts of the surface of the fill material. Piezoelectric element 116 is then covered with a suitable etch stop layer, such as a layer of molybdenum.

A layer of piezoelectric material having a thickness equal to the design thickness of piezoelectric element 156 (FIG. 2) is then deposited under deposition conditions that promote the formation of reverse c-axis material. The reverse c-axis material is then patterned by photolithographically-defined etching to define piezoelectric element 156. The patterning exposes piezoelectric element 116, and additionally exposes part of the surface of fill material 105 and bonding pads 132 and 172. The etch stop layer protects piezoelectric element 116 during the patterning of the layer of reverse c-axis material to define piezoelectric element 156. The etch stop layer is then removed.

Fabrication of the transformer continues by performing the processes described above with reference to FIGS. 5F–5H and 5R–5T. A process similar to that just described is then used to form piezoelectric element 126 of normal c-axis material and piezoelectric element 166 of reverse c-axis material shown in FIG. 5J. Piezoelectric elements 126 and 166 may alternatively be formed in other ways. Fabrication of the transformer is then completed by performing the processes described above with reference to FIGS. 5K and 5L, and 5W and 5X.

In another alternative, the processes described above with reference to FIGS. 5A and 5M, 5B and 5N, and 5C and 5O are performed. A layer of piezoelectric material having a thickness equal to the design thickness of piezoelectric element 116 is then deposited under deposition conditions that promote the formation of normal c-axis material. The normal c-axis material is then patterned to define piezoelectric element 116. The patterning exposes electrode 152, bonding pad 132, part of electrical trace 133, bonding pad 172 and electrical trace 173 and additionally defines windows 119 that provide access to additional parts of the surface of the fill material. A layer of photoresist or other protective material is deposited and is patterned to define a window similar in shape and extent to seed layer 155 shown in FIG. 5D. Electrode 152 is exposed through the window.

A layer of reverse c-axis piezoelectric material having a thickness equal to the design thickness of piezoelectric element 156 is then deposited under deposition conditions that promote the formation of reverse c-axis material. The layer of reverse c-axis piezoelectric material is then patterned using a lift-off process to define piezoelectric element 156. The lift-off process removes all the reverse c-axis material deposited on the photoresist but leaves reverse c-axis material deposited in the window defined in the photoresist. The photoresist is then removed.

Fabrication of the transformer continues by performing the processes described above with reference to 5F–5H and 5R–5T. A process similar to that just described is then used to form piezoelectric element 126 of normal c-axis material and piezoelectric element 166 of reverse c-axis material shown in FIG. 5J. Piezoelectric elements 126 and 166 may alternatively be formed in other ways. Fabrication of the transformer is then completed by performing the processes described above with reference to FIGS. 5K and 5L, and 5W and 5X.

The normal c-axis piezoelectric material and the reverse c-axis piezoelectric material may be deposited in a reverse order to that just described.

FIGS. 7A–7F illustrate an exemplary embodiment of a method of making an embodiment 300 of a thin-film acoustically-coupled transformer in accordance with the invention in which the piezoelectric elements each comprise a layer of a poled ferroelectric material. Elements of thin-film acoustically-coupled transformer 300 that correspond to elements of thin-film acoustically-coupled transformer 100 described above with reference to FIGS 1A–1C and 2 are indicated by the same reference numerals and will not be described again in detail.

In thin-film acoustically-coupled transformer 300, the piezoelectric material of piezoelectric layers 117 and 127 is a poled ferroelectric material. The portion of piezoelectric layer 117 that constitutes piezoelectric element 116 is poled in the normal direction whereas the portion of piezoelectric layer 117 that constitutes piezoelectric element 156 is poled in the reverse direction. Similarly, the portion of piezoelectric layer 127 that constitutes piezoelectric element 126 is poled in the normal direction whereas the portion of piezoelectric layer 127 that constitutes piezoelectric element 166 is poled in the reverse direction. The opposite poling of the portions of the piezoelectric layers is imposed by applying electric fields in opposite directions to the respective portions.

FIGS. 7A–7F are plan views illustrating the processing of a wafer 302 to fabricate exemplary embodiments of thin-film acoustically-coupled transformers 300 similar to thin-film acoustically-coupled transformer 100 described above with referenced to FIGS. 1A–1C. As noted above, thousands of thin-film acoustically-coupled transformers are typically fabricated on a single wafer. However, the number of thin-film acoustically-coupled transformers shown in FIGS. 7A–7F has been reduced to four to simplify the drawing. The quantitative examples set forth below relate to an embodiment of thin-film acoustically-coupled transformer 300 suitable for operation at a frequency of about 1.9 GHz. Embodiments suitable for operation at other frequencies will differ in such details.

Figure 7A:
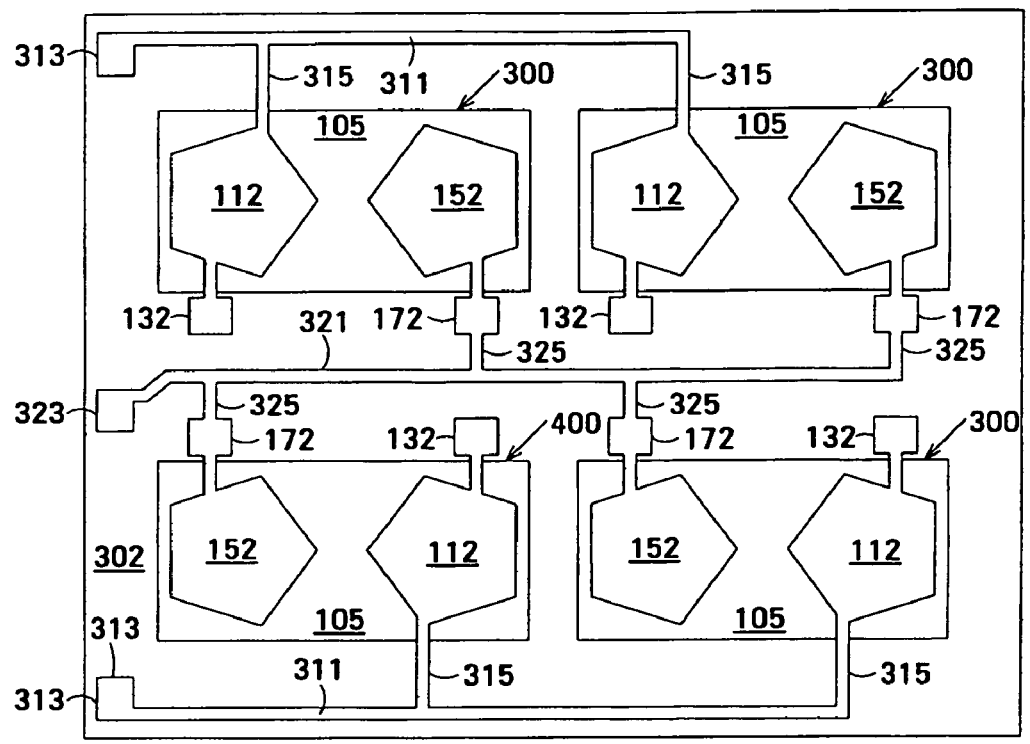
FIGS. 7A–7F are plan views illustrating another exemplary method in accordance with the invention for making a third embodiment of an acoustically-coupled transformer in accordance with the invention in which the piezoelectric elements each comprise a layer of a poled ferroelectric material.

First, the processes described above with reference to FIGS. 5A and 5M, and 5B and 5N are performed. Then, a first metal layer is deposited on the wafer. In an embodiment in which the material of piezoelectric layer 317 (FIG. 7B) is a perovskite ferroelectric such as lead zirconium titanate (PZT), the material of the first metal layer is platinum or iridium. These materials are compatible with the deposition process later used to deposit piezoelectric layer 317. Alternatively, the material of the first metal layer is a refractory metal, such as molybdenum, coated with a thin protective layer of platinum or iridium. The layer of refractory metal has a thickness that differs from the design thickness of the first metal layer by the thickness of the protective layer. The protective layer provides the above-mentioned deposition process compatibility. The first metal layer is patterned to define electrodes 112 and 152, bonding pad 132, electrical trace 133, bonding pad 172 and electrical trace 173 all located on fill material 105, as shown in FIG. 7A and as described above with reference to FIGS. 5C and 5O. The first metal layer is also patterned to define level 1 normal busses 311, a level 1 normal contact pad 313 at one end of each of busses 311 and an electrical trace 315 that extends from the electrode 112 of each transformer 300 to an adjacent one of level 1 normal busses 311. The first metal layer is additionally patterned to define level 1 reverse bus 321, a level 1 reverse contact pad 323 at one end of bus 321 and an electrical trace 325 that extends from the bonding pad 172 of each transformer 300 to level 1 reverse bus 321.

Figure 7B:
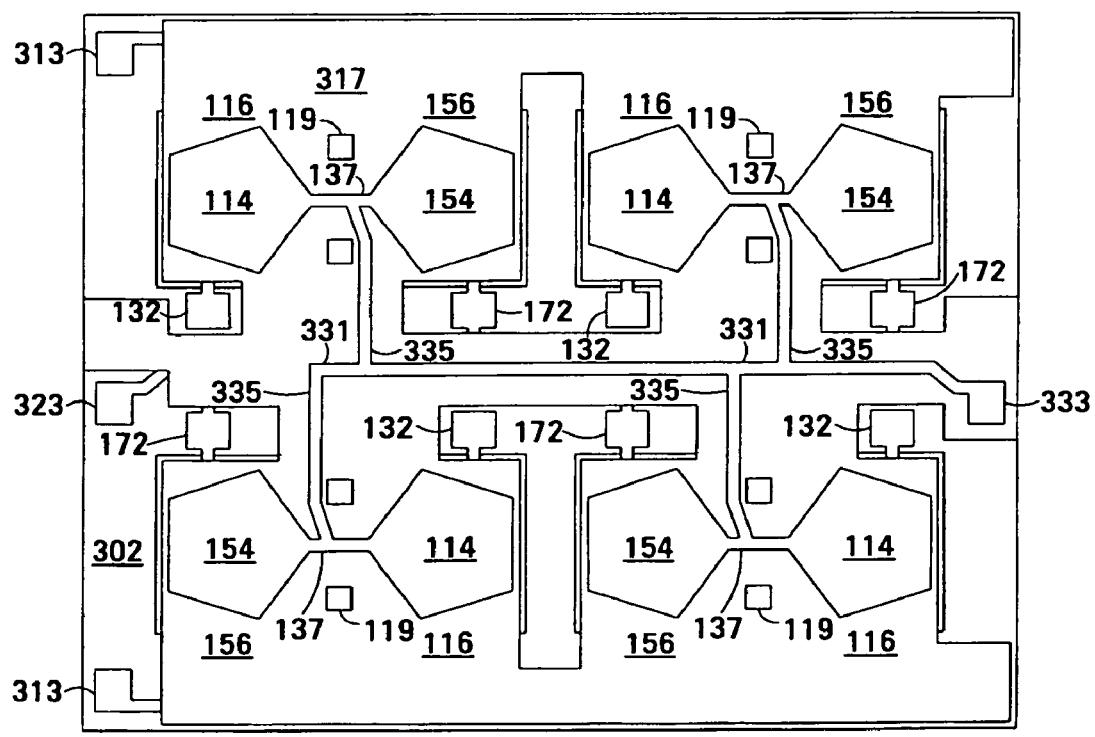

A first layer of ferroelectric material is then deposited and is patterned to define piezoelectric layer 317 that provides piezoelectric element 116 and piezoelectric element 156, as shown in FIG. 7B. Piezoelectric layer covers at least electrode 112 and 152 (FIG. 7A) and additionally covers level 1 busses 311 and 321. The patterning exposes part of the surface of fill material 105, bonding pads 132 and 172, level 1 normal contact pad 313 and level 1 reverse contact pad 323, and additionally defines windows 119.

In an embodiment, the ferroelectric material deposited and patterned to define piezoelectric layer 317 was lead zirconium titanate (PZT) and was deposited with a thickness of about 500 nm by a process such as RF sputtering, sol gel or metal-organic chemical vapor deposition (MOCVD). The ferroelectric material was patterned by wet etching or chlorine-based dry etching. Alternative ferroelectric materials include perovskite ferroelectric materials, such as lead meta niobate and barium titanate.

A second metal layer is deposited. In an embodiment in which the material of piezoelectric layer 327 (FIG. 7D) is a perovskite ferroelectric material such as lead zirconium titanate (PZT), the material of the second metal layer is platinum or iridium. These materials are compatible with the deposition process later used to deposit piezoelectric layer 327. Alternatively, the second metal layer is composed of a thin protective layer of platinum or iridium molybdenum adjacent piezoelectric layer 317 and a layer of a refractory metal such as molybdenum. The layer of refractory metal has a thickness that differs from the design thickness of the second metal layer by the thickness of the protective layer. The protective layer provides the above-mentioned deposition process compatibility. The second metal layer and is patterned to define electrode 114, electrode 154 and electrical trace 137 as described above with reference to FIGS. 5F and 5R and as shown in FIG. 7B. The second metal layer is additionally patterned to define a level 2 bus 331, a level 2 contact pad 333 at one end of bus 331 and an electrical trace 335 that extends from the electrical trace 137 of each transformer 300 to level 2 bus 331.

Figure 7C:
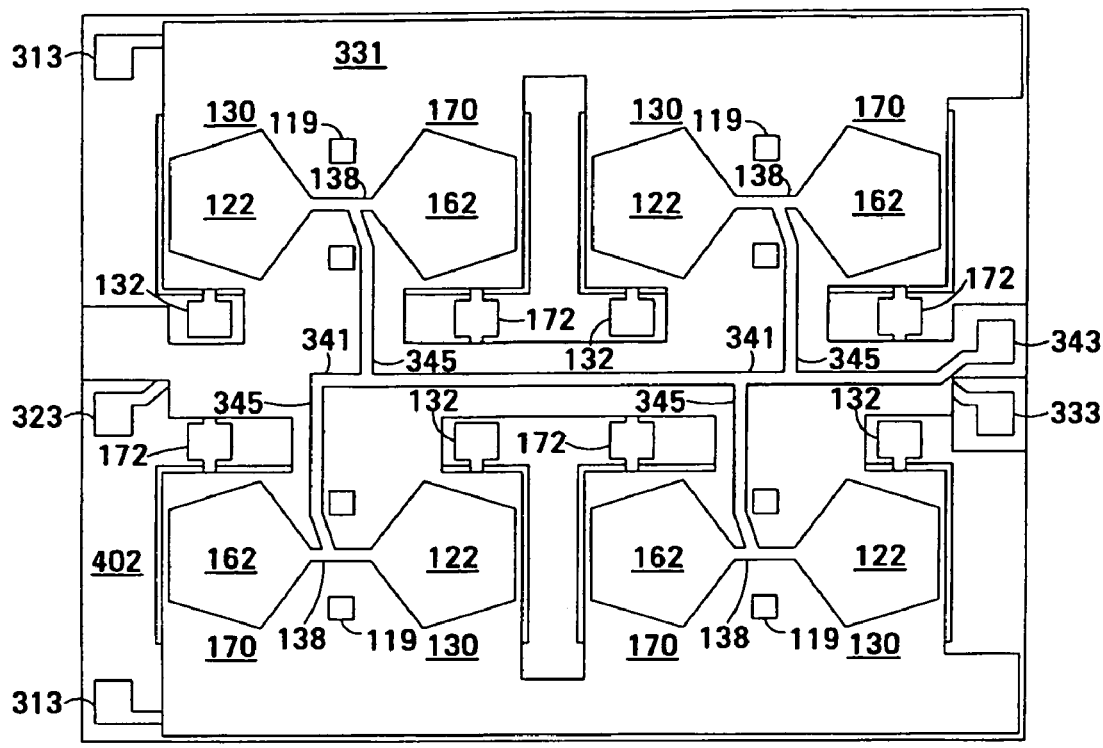

A layer of acoustic decoupling material is then deposited and is patterned to define an acoustic decoupling layer 331 that provides acoustic decoupler 130 and acoustic decoupler 170, as described above with reference to FIGS. 5G and 5S, and as shown in FIG. 7C. Acoustic decoupling layer 331 covers electrode 114 and electrode 154 (FIG. 7B) and additionally covers level 2 bus 331. The patterning exposes part of the surface of fill material 105, bonding pads 132 and 172, level 1 contact pads 313 and 323 and level 2 contact pad 333, and additionally defines windows 119.

A third metal layer is deposited on the wafer. In an embodiment in which the material of piezoelectric layer 327 (FIG. 7D) is a perovskite ferroelectric material such as lead zirconium titanate (PZT), the material of the third metal layer is platinum or iridium. These materials are compatible with the deposition process later used to deposit piezoelectric layer 327. Alternatively, the third metal layer is composed of a layer of a refractory metal, such as molybdenum, coated with a thin protective layer of platinum or iridium. The layer of refractory metal has a thickness that differs from the design thickness of the third metal layer by the thickness of the protective layer. The protective layer provides the above-mentioned deposition process compatibility. The third metal layer is patterned to define electrode 122, electrode 162 and electrical trace 138, as described above with reference to FIGS. 5H and 5T, and as shown in FIG. 7C. The third metal layer is additionally patterned to define a level 3 bus 341, a level 3 contact pad 343 at one end of bus 341 and an electrical trace 194 that extends from the electrical trace 138 of each transformer 300 to level 3 bus 341.

Figure 7D:
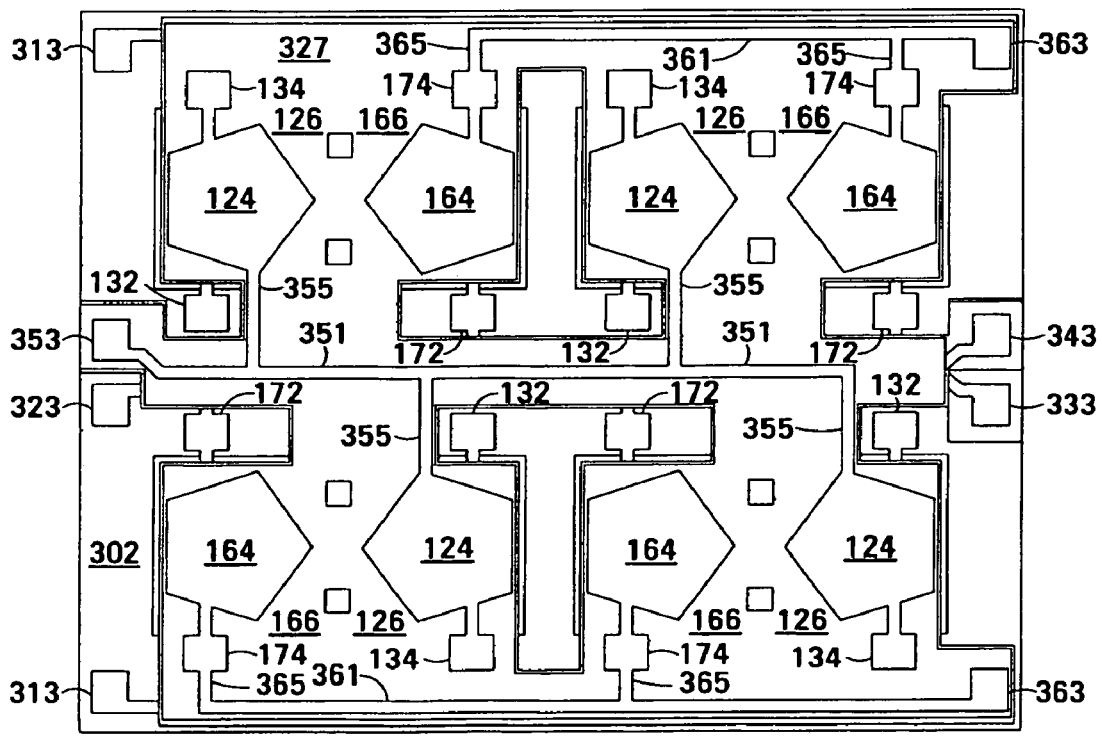

A second layer of ferroelectric material is then deposited on the wafer and is patterned to define piezoelectric layer 327 that provides piezoelectric elements 126 and 166, as shown in FIG. 7D. Piezoelectric layer 327 covers electrodes 122 and 162 and additionally covers level 3 bus 341. The patterning exposes part of the surface of fill material 105, bonding pads 132 and 172, level 1 contact pads 313 and 323, level 2 contact pad 333 and level 3 contact pad 343, and additionally defines windows 119.

In an embodiment, the ferroelectric material deposited and patterned to form piezoelectric layer 327 was PZT and was deposited with a thickness of about 500 nm by a process such as RF sputtering, sol gel or metal-organic chemical vapor deposition (MOCVD). The ferroelectric material was patterned by wet etching or by chlorine-based dry etching. Alternative ferroelectric materials include perovskite ferroelectric materials such as lead meta niobate and barium titanate.

A fourth metal layer is deposited. The material of the fourth metal layer is a refractory metal such as molybdenum. A refractory metal can be used as the material of the fourth metal layer because no perovskite ferroelectric material deposition process is performed after the fourth metal layer is deposited. The fourth metal layer is patterned to define electrode 124, electrode 164, bonding pad 134, electrical trace 135, bonding pad 174 and electrical trace 175, as described above with reference to FIGS. 5H and 5T and as shown in FIG. 7D. The fourth metal layer is additionally patterned to define a level 4 normal bus 351, a level 4 normal contact pad 353 at one end of bus 351 and an electrical trace 355 that extends from the electrode 124 of each transformer 300 to level 4 normal bus 351. The fourth metal layer is additionally patterned to define level 4 reverse busses 361, a level 4 reverse contact pad 363 at the end of each bus 361 and an electrical trace 365 that extends from the bonding pad 174 of each transformer 300 to the adjacent reverse level 4 bus 361, as shown in FIG. 7D.

In an embodiment, the above-described metal layers were formed by depositing molybdenum with a thickness of about 440 nm by sputtering, and were patterned by dry etching. Alternatives similar to those described above are possible.

Figure 7E:
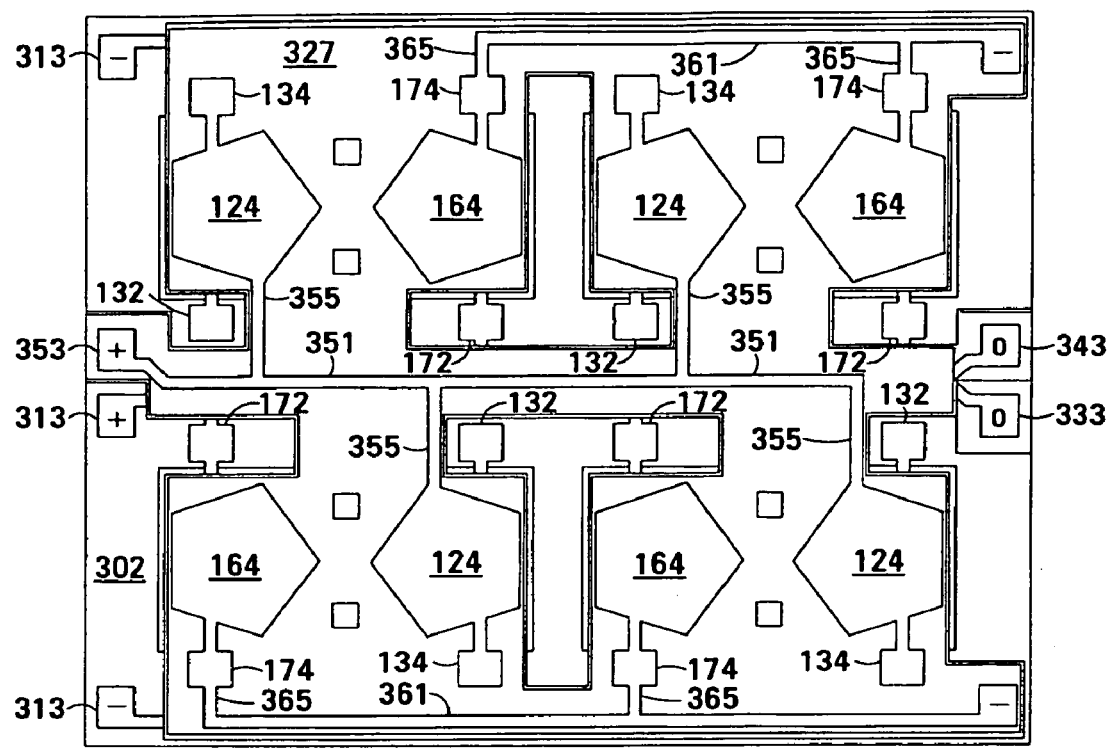

Referring now to FIG. 7E and additionally to FIGS. 7A–7C, wafer 302 is heated to a temperature of about 125° C. and poling voltages are applied to the contact pads as follows: level 2 contact pad 333 and level 3 contact pad 343 are grounded, level 1 normal contact pads 313 and level 4 reverse contact pads 363 are connected to a negative poling voltage, and level 1 reverse contact pad 323 and level 4 normal contact pad 353 are connected to a positive poling voltage. This arrangement of poling voltages is applied via busses 311, 321, 331, 341, 351 and 361 and traces 315, 325, 335, 345, 355 and 365 to electrodes 112, 114, 122, 124, 152, 154, 162 and 164. The electrodes apply a poling electric field directed away from wafer 302 across the piezoelectric elements of FBARs 110 and 120 (FIG. 2), and apply a poling electric field directed towards wafer 302 across the piezoelectric elements of FBARs 150 and 160 (FIG. 2). The poling electric fields set the c-axes of the piezoelectric element 156 of FBAR 150 and piezoelectric element 166 of FBAR 160 opposite in direction to the c-axes of the piezoelectric element 116 of FBAR 110 and the piezoelectric element 126 of FBAR 120.

In another embodiment, poling voltages of polarities inverse to those indicated are applied to the contact pads to set the directions of the c-axes of the piezoelectric elements opposite to those shown in FIG. 2. In another embodiment, poling voltages of polarities opposite those indicated in FIG. 7E are applied to contact pads 353 and 363 to set the c-axis of piezoelectric element 166 opposite in direction to the c-axis of piezoelectric element 156 and to set the c-axis of piezoelectric element 126 opposite in direction to the c-axis of piezoelectric element 116. Other combinations of poling voltages may be used to set the c-axes of the piezoelectric elements of the lower FBARs opposite in direction to one another and to set the c-axes of the piezoelectric elements of the upper FBARs opposite in direction to one another.

In an embodiment, the poling voltages are in the range from about 250 mV to about 1 V. With piezoelectric elements 116, 126, 156 and 166 having a thickness of about 500 nm, as described above, poling voltages in this range apply a poling electric field in the range from about 250 kV/m to about 1 MV/m to the piezoelectric elements.

Figure 7F:
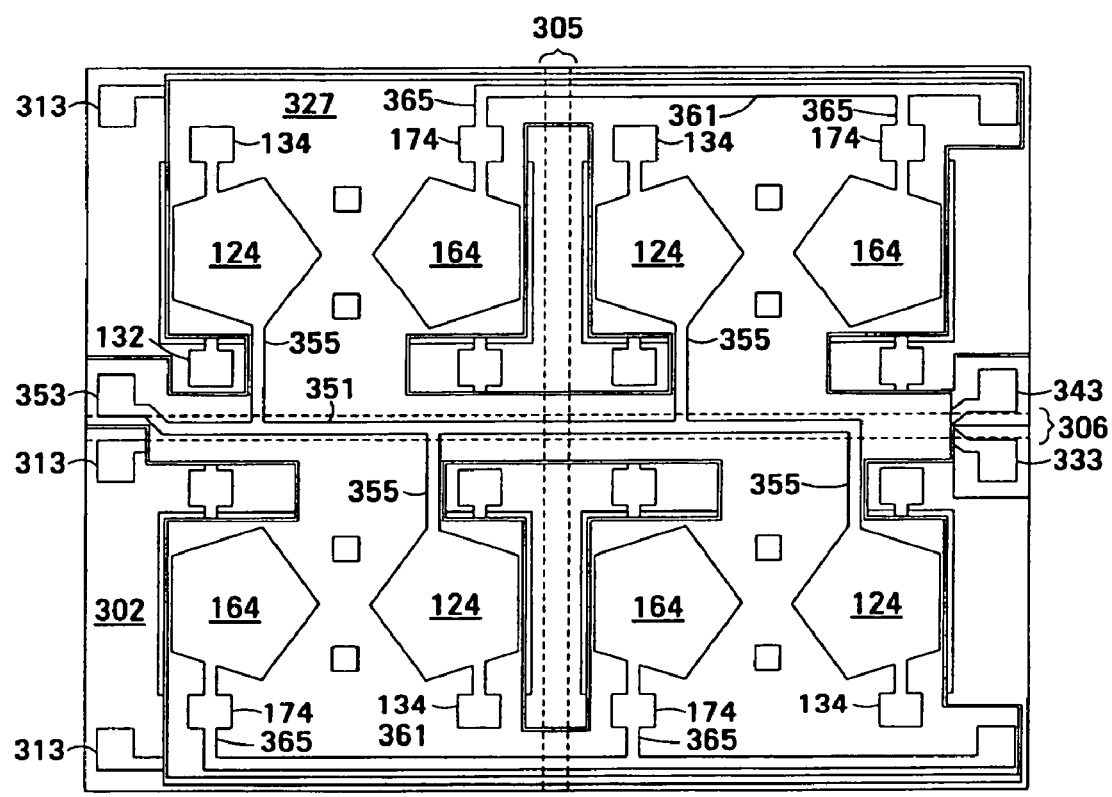

Wafer 300 is then divided into individual thin-film acoustically-coupled transformers by a known singulation process that removes the regions of wafer 302 indicated by broken line pairs 305 and 306 shown in FIG. 7F. The singulation process additionally separates traces 315, 325, 335, 345, 355 and 365 (FIGS. 7A–7D) from busses 311, 321, 331, 341, 351 and 361. This breaks the electrical connections between the electrodes formerly interconnected by the traces and busses.

Referring once again to FIG. 2, in other embodiments of a thin-film acoustically-coupled transformer in accordance with the invention in which the c-axes of the piezoelectric elements of the lower FBARs are opposite in direction and the c-axes of the piezoelectric element of the upper FBARs are opposite in direction, electrical circuits 141 and 142 may be configured to interconnect the lower FBARs and the upper FBARs, respectively, differently from the above-described example.

In such other embodiments, the electrical circuits 141 and 142 may electrically connect the lower FBARs and the upper FBARs, respectively, in any one of a parallel, a series, an anti-parallel and an anti-series configuration. Of the sixteen possible combinations of the parallel, series, anti-parallel and anti-series electrical circuit configurations, only eight produce a working transformer. The combination of electrical circuit configurations connecting the FBARs determines the impedance and impedance transformation ratio of the transformer, i.e., 1:1 low impedance, 1:1 high impedance, 1:4 or 4:1, and whether the transformer is electrically balanced or electrically unbalanced. The possible combinations of electrical circuit configurations are summarized in Table 1 below:

TABLE 1

|  | Parallel | Series | Anti-parallel | Anti-series |
| --- | --- | --- | --- | --- |
| Parallel | U 1:1 LOW | X | X | U 1:4 |
| Series | X | B 1:1 HI | B 4:1 | X |
| Anti-parallel | X | B 1:4 | B 1:1 LOW | X |
| Anti-series | U 4:1 | X | X | U 1:1 HI |

In Table 1, the row captions indicate the configuration of one of the electrical circuits, e.g., electrical circuit 141, the column captions indicate the configuration of the other of the electrical circuits, e.g., electrical circuit 142, B denotes that the transformer is electrically balanced, and X denotes a non-functioning transformer. The impedance transformation ratio shown is the impedance transformation from electrical terminals connected to the electrical circuit indicated by the row caption to electrical terminals connected to the electrical circuit indicated by the column caption. LOW denotes that the transformer has a low impedance, equivalent to that of two FBARs in parallel; HI indicates that the transformer has a high impedance, equivalent to that of two FBARs in series. Electrodes connected in parallel or in anti-series have in-phase voltages on them whereas electrodes connected in series or in anti-parallel have antiphase voltages on them.

This disclosure describes the invention in detail using illustrative embodiments. However, the invention defined by the appended claims is not limited to the precise embodiments described.

We claim:

1. A method of making an acoustically-coupled transformer, the method comprising:
    fabricating a first stacked bulk acoustic resonator (SBAR) and a second SBAR, the fabricating comprising:
       forming lower film bulk acoustic resonators (FBARs) and upper FBARs, each of the FBARs comprising opposed planar electrodes and a piezoelectric element therebetween, the piezoelectric element characterized by a c-axis, the forming comprising setting the c-axes of the piezoelectric elements of the lower FBARs opposite in direction and setting the c-axes of the upper FBARs opposite in direction, and
       locating an acoustic decoupler between the lower FBAR and the upper FBAR of each SBAR;
    electrically connecting the lower FBAR of the first SBAR to the lower FBAR of the second SBAR; and
    electrically connecting the upper FBAR of the first SBAR to the upper FBAR of the second SBAR.

2. The method of claim 1, in which:
    the forming additionally comprises:
       depositing and patterning a metal layer to define a pair of the electrodes, and
       depositing a layer of piezoelectric material over the electrodes; and
    the setting comprises depositing a seed layer of reverse c-axis piezoelectric material on one of the electrodes prior to depositing the layer of piezoelectric material.

3. The method of claim 2, in which depositing the seed layer comprises:
    depositing the seed layer on the pair of electrodes; and
    removing the seed layer from the other of the electrodes.

4. The method of claim 2, in which:
    depositing the seed layer is performed under first deposition conditions that promote the formation of reverse c-axis material; and
    depositing the layer of piezoelectric material is performed under second deposition conditions that promote the formation of normal c-axis material, the portion of the layer deposited on the seed layer being reverse c-axis material notwithstanding its deposition under the second deposition conditions.

5. The method of claim 4, in which the first deposition conditions comprise an oxygen-rich environment and the second deposition conditions comprise a nitrogen-rich environment.

6. The method of claim 1, in which:
    the forming additionally comprises:
       depositing and patterning a metal layer to define a pair of the electrodes; and
       depositing a layer of piezoelectric material on the electrodes, the layer comprising a region of reverse c-axis material on one of the electrodes and a region of normal c-axis material on the other of the electrodes; and
    the setting comprises depositing the regions using different deposition conditions.

7. The method of claim 6, in which depositing the layer of piezoelectric material comprises:
    depositing a first layer under first deposition conditions to form one of (a) reverse c-axis piezoelectric material and (b) normal c-axis p
    removing a portion of the first layer to expose one of the electrodes; and
    depositing a second layer under second deposition conditions to form the other of (a) reverse c-axis piezoelectric material and (b) normal c-axis piezoelectric material; and
    removing a portion of the second layer to expose the first layer.

8. The method of claim 7, in which one of the deposition conditions comprises an oxygen-rich environment and the other of the deposition conditions comprises a nitrogen-rich environment.

9. The method of claim 7, in which the removing is performed by etching.

10. The method of claim 7, in which the removing is performed by a lift-off process.

11. The method of claim 1, in which:
    the forming additionally comprises:
       depositing a metal layer and patterning same to define a pair of first electrodes,
       depositing a layer of ferroelectric material over the first electrodes, and
       depositing an additional metal layer and patterning same to define a pair of second electrodes opposite the first electrodes; and
    the setting comprises applying a poling voltage of a nominal polarity between one of the first electrodes and an opposed one of the second electrodes and applying a poling voltage of an opposite polarity between the other of the first electrodes and the other of the second electrodes.

12. The method of claim 11, in which:
the method additionally comprises:
  providing a wafer, and
  fabricating an array of the transformers on the wafer; and the applying comprises electrically interconnecting corresponding ones of the electrodes of the transformers.

13. The method of claim 12, additionally comprising singulating the wafer to separate the transformers from one another, the singulating comprising severing the interconnections between the electrodes.

* * * * *

UNITED STATES PATENT AND TRADEMARK OFFICE
CERTIFICATE OF CORRECTION

PATENT NO.        : 7,367,095 B2
APPLICATION NO.   : 11/404403
DATED             : May 6, 2008
INVENTOR(S)       : John D. Larson, III et al.

It is certified that error appears in the above-identified patent and that said Letters Patent is hereby corrected as shown below:

First Page, Column 2, (Other Publications), Line 2, delete "Sysmposium" and insert -- Symposium --;

Column 24, Line 39, Claim 7, delete "p" and insert -- piezoelectric material; --.

Signed and Sealed this

Eighth Day of June, 2010

David J. Kappos
*Director of the United States Patent and Trademark Office*